US012652942B2

(12) United States Patent
Kim et al.

(10) Patent No.: US 12,652,942 B2
(45) Date of Patent: Jun. 9, 2026

(54) DISPLAY DEVICE INCLUDING LIGHT BLOCKING PORTION AND PROTRUSION

(71) Applicant: Samsung Display Co., Ltd., Yongin-si (KR)

(72) Inventors: Gee-Bum Kim, Seoul (KR); Bokwang Song, Hwaseong-si (KR); Kwang Soo Bae, Yongin-si (KR); Dae-Young Lee, Seoul (KR); Min Oh Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 665 days.

(21) Appl. No.: 18/063,561

(22) Filed: Dec. 8, 2022

(65) Prior Publication Data

US 2023/0263039 A1      Aug. 17, 2023

(30) Foreign Application Priority Data

Feb. 11, 2022    (KR) ........................ 10-2022-0018359

(51) Int. Cl.
| | |
|---|---|
| *H10K 65/00* | (2023.01) |
| *H10K 59/126* | (2023.01) |
| *H10K 59/38* | (2023.01) |
| *H10K 59/80* | (2023.01) |
| *G06V 10/10* | (2022.01) |
| *G06V 10/14* | (2022.01) |

(Continued)

(52) U.S. Cl.
CPC .......... H10K 65/00 (2023.02); H10K 59/126 (2023.02); H10K 59/38 (2023.02); H10K 59/873 (2023.02);

(Continued)

(58) Field of Classification Search
CPC .......... H10K 50/85; H10K 50/844813; H10K 59/126; H10K 59/38; H10K 59/873;

(Continued)

(56) References Cited

U.S. PATENT DOCUMENTS

| | | | |
|---|---|---|---|
| 8,675,156 B2 * | 3/2014 | Shin | .................. G02F 1/133512 |
| | | | 349/110 |
| 10,048,530 B1 * | 8/2018 | Kim | .................. G02F 1/133514 |

(Continued)

FOREIGN PATENT DOCUMENTS

| | | | | | |
|---|---|---|---|---|---|
| CN | 102856508 A | * | 1/2013 | ......... | H10K 59/8722 |
| CN | 111712785 A | * | 9/2020 | .......... | G06F 3/0412 |

(Continued)

OTHER PUBLICATIONS

Extended European Search Report report dated Jun. 30, 2023, in corresponding EP Patent Application No. 23155662.2 (8 pages).

*Primary Examiner* — Ida M Soward
(74) *Attorney, Agent, or Firm* — Womble Bond Dickinson (US) LLP

(57) ABSTRACT

A display device includes: a display panel to display an image; and a light blocking layer over the display panel. The display panel includes: a base layer; and an element layer over the base layer, the element layer including a light emitting element, a light receiving element, and an element defining film between the light emitting element and the light receiving element. The light blocking layer includes: a light blocking portion overlapping with the element defining film in a plan view, the light blocking portion having a first light blocking opening overlapping with the light emitting element, and a second light blocking opening overlapping with the light receiving element; and a protrusion protruding from the light blocking portion toward the element defining film.

29 Claims, 14 Drawing Sheets

(51) Int. Cl.

| | |
|---|---|
| *G06V 40/13* | (2022.01) |
| *H10K 50/813* | (2023.01) |
| *H10K 59/12* | (2023.01) |
| *H10K 59/35* | (2023.01) |
| *H10K 59/40* | (2023.01) |

(52) U.S. Cl.

CPC .............. *G06V 10/14* (2022.01); *G06V 10/17* (2022.01); *G06V 40/1318* (2022.01); *H10K 50/813* (2023.02); *H10K 59/12* (2023.02); *H10K 59/35* (2023.02); *H10K 59/352* (2023.02); *H10K 59/40* (2023.02)

(58) Field of Classification Search

CPC ...... H10K 59/35; H10K 59/122; H10K 59/60; H10K 59/40; H10K 59/12; H10K 59/352; H10K 65/00; G06F 3/0445; G06F 3/0412; G06V 10/14; G06V 10/17; G06V 40/1318; G09G 3/3208

See application file for complete search history.

(56) References Cited

U.S. PATENT DOCUMENTS

| | | | |
|---|---|---|---|
| 10,552,696 | B2 | 2/2020 | Cho et al. |
| 12,048,227 | B2 | 7/2024 | Hatsumi et al. |
| 12,150,336 | B2 * | 11/2024 | Lee .................. B29D 11/00365 |
| 2013/0075761 | A1 | 3/2013 | Akiyama |
| 2017/0025480 | A1 * | 1/2017 | Chiang .................. H10K 59/40 |
| 2017/0344153 | A1 * | 11/2017 | Kim ...................... G09G 3/2011 |
| 2020/0066804 | A1 * | 2/2020 | Jung ...................... H10K 59/38 |
| 2020/0266253 | A1 * | 8/2020 | Kim .................. H10K 59/8792 |
| 2020/0321401 | A1 * | 10/2020 | Ahn ...................... H01L 23/544 |
| 2021/0066669 | A1 | 3/2021 | Kubota et al. |
| 2021/0167144 | A1 | 6/2021 | Lim et al. |
| 2021/0327979 | A1 | 10/2021 | Kamada et al. |
| 2021/0397806 | A1 | 12/2021 | Lu et al. |
| 2022/0057873 | A1 | 2/2022 | Kubota et al. |
| 2022/0285461 | A1 | 9/2022 | Hatsumi et al. |
| 2023/0229270 | A1 * | 7/2023 | Yoo ...................... G06F 3/0445 |
| | | | 345/173 |

FOREIGN PATENT DOCUMENTS

| | | | |
|---|---|---|---|
| JP | 2021-39342 | A | 3/2021 |
| KR | 10-2018-0067196 | A | 6/2018 |
| KR | 10-2021-0069776 | A | 6/2021 |
| KR | 10-2021-0126649 | A | 10/2021 |
| WO | 2020136495 | A1 | 7/2020 |
| WO | WO 2020/165686 | A1 | 8/2020 |
| WO | 2021024082 | A1 | 2/2021 |
| WO | 2022248984 | A1 | 12/2022 |

* cited by examiner

DISPLAY DEVICE INCLUDING LIGHT BLOCKING PORTION AND PROTRUSION

CROSS-REFERENCE TO RELATED APPLICATION

This application claims priority to and the benefit of Korean Patent Application No. 10-2022-0018359, filed on Feb. 11, 2022 in the Korean Intellectual Property Office, the entire disclosure of which is incorporated by reference herein.

BACKGROUND

1. Field

Aspects of embodiments of the present disclosure relate to a display device, and more particularly, to a display device capable of biometric information recognition.

2. Description of Related Art

A display device provides various functions that enable a user to interact with the display device. For example, the display device may display an image to provide information to a user, or may sense a user input. Recent display devices include a function for sensing biometric information of a user.

Biometric information may be recognized, for example, by using a capacitive sensing technique for sensing a change in capacitance formed between electrodes, a light sensing technique for sensing incident light using an optical sensor, or an ultrasonic sensing technique for sensing vibrations using a piezoelectric element.

The above information disclosed in this Background section is for enhancement of understanding of the background of the present disclosure, and therefore, it may contain information that does not constitute prior art.

SUMMARY

One or more embodiments of the present disclosure are directed to a display device including a sensor having improved sensing performance for biometric information recognition.

According to one or more embodiments of the present disclosure, a display device includes: a display panel configured to display an image; and a light blocking layer over the display panel. The display panel includes: a base layer; and an element layer over the base layer, the element layer including a light emitting element, a light receiving element, and an element defining film between the light emitting element and the light receiving element. The light blocking layer includes: a light blocking portion overlapping with the element defining film in a plan view, the light blocking portion having a first light blocking opening overlapping with the light emitting element, and a second light blocking opening overlapping with the light receiving element; and a protrusion protruding from the light blocking portion toward the element defining film.

In an embodiment, the display device may further include an input sensing layer between the display panel and the light blocking layer.

In an embodiment, the input sensing layer may include: a conductive layer; and an insulating layer on the conductive layer.

In an embodiment, the insulating layer may include a groove corresponding to the protrusion, and the protrusion may be accommodated in the groove.

In an embodiment, the protrusion may be located between the first light blocking opening and the second light blocking opening.

In an embodiment, the protrusion may surround the second light blocking opening.

In an embodiment, the element defining film may include: a first defining area adjacent to the light receiving element; and a second defining area between the light emitting element and the first defining area, and the protrusion may be located at the first defining area.

In an embodiment, the first light blocking opening and the second light blocking opening may be located along a first reference direction, and a first width of the first defining area in the first reference direction may be equal to a second width of the second defining area in the first reference direction.

In an embodiment, the first defining area may include: a first area adjacent to the second defining area; a second area adjacent to the light receiving element; and a third area between the first area and the second area. The protrusion may overlap with the first area and the third area.

In an embodiment, the protrusion may not overlap with the second area.

In an embodiment, the light receiving element may have a third width in the first reference direction, and the protrusion may have a width in the first reference direction that is smaller than or equal to half of the third width.

In an embodiment, the protrusion may not overlap with the second light blocking opening.

In an embodiment, the light receiving element may have a third width in the first reference direction, the light emitting element may have a fourth width in the first reference direction, and the protrusion may protrude toward the element defining film in a second reference direction, and a height of the protrusion in the second reference direction may be proportional to half of a difference between the fourth width and the third width.

In an embodiment, the protrusion may protrude toward the element defining film in a second reference direction, and a width of the protrusion in the first reference direction may be greater than a height of the protrusion in the second reference direction.

In an embodiment, the protrusion may include a first sub-protrusion, and a second sub-protrusion spaced from the first sub-protrusion.

In an embodiment, the first sub-protrusion may have a first sub-width in the first reference direction, the second sub-protrusion may have a second sub-width in the first reference direction, the first sub-protrusion and the second sub-protrusion may be spaced from each other in the first reference direction by a third sub-width, and the light receiving element may have a third width in the first reference direction, and a sum of the first sub-width, the second sub-width, and the third sub-width may be smaller than or equal to half of the third width.

In an embodiment, the display device may further include a color filter overlapping with the light emitting element and the light receiving element.

In an embodiment, the display device may further include an encapsulation layer on the element layer.

In an embodiment, the protrusion may protrude toward the encapsulation layer.

In an embodiment, the display device may further include a circuit layer between the base layer and the element layer, and the circuit layer may include: a pixel drive circuit electrically connected with the light emitting element, and configured to control an operation of the light emitting element; and a sensing drive circuit electrically connected with the light receiving element, and configured to control an operation of the light receiving element.

According to one or more embodiments of the present disclosure, a display device includes: a display panel configured to display an image; an input sensing layer on the display panel; and a color filter layer on the input sensing layer. The display panel includes: a base layer; and an element layer over the base layer, the element layer including a light emitting element, a light receiving element, and an element defining film between the light emitting element and the light receiving element. The color filter layer includes a color filter overlapping with the light emitting element and the light receiving element, and a light blocking layer. The light blocking layer includes: a light blocking portion overlapping with the element defining film; and a protrusion protruding toward the element defining film, and overlapping with the element defining film.

In an embodiment, the input sensing layer may include: a conductive layer on the display panel; and a first insulating layer on the conductive layer. The first insulating layer may include a first groove corresponding to the protrusion, and the protrusion may be accommodated in the first groove.

In an embodiment, the input sensing layer may include: a conductive layer on the display panel; a first insulating layer on the conductive layer; and a second insulating layer on the first insulating layer. The second insulating layer may include a second groove corresponding to the protrusion, and the protrusion may be accommodated in the second groove.

In an embodiment, the display panel may further include a circuit layer between the base layer and the element layer, and the circuit layer may include: a pixel drive circuit electrically connected with the light emitting element, and configured to control an operation of the light emitting element; and a sensing drive circuit electrically connected with the light receiving element, and configured to control an operation of the light receiving element.

In an embodiment, the color filter may include: a first sub-color filter overlapping with the light emitting element; and a second sub-color filter overlapping with the light receiving element, and the protrusion may be located between the first sub-color filter and the second sub-color filter.

In an embodiment, the protrusion may be adjacent to the second sub-color filter.

In an embodiment, the protrusion may surround the second sub-color filter.

In an embodiment, the display panel may further include an encapsulation layer on the element layer.

In an embodiment, the input sensing layer may be directly on the encapsulation layer.

BRIEF DESCRIPTION OF THE DRAWINGS

The above and other aspects and features of the present disclosure will be more clearly understood from the following detailed description of the illustrative, non-limiting embodiments with reference to the accompanying drawings.

FIGS. 7A-7B are cross-sectional views of the display device illustrating an operation of calculating fingerprint information of a user according to an embodiment of the present disclosure.

FIGS. 8A-8D are schematic cross-sectional views illustrating protrusions according to embodiments of the present disclosure.

DETAILED DESCRIPTION

Figure 1:
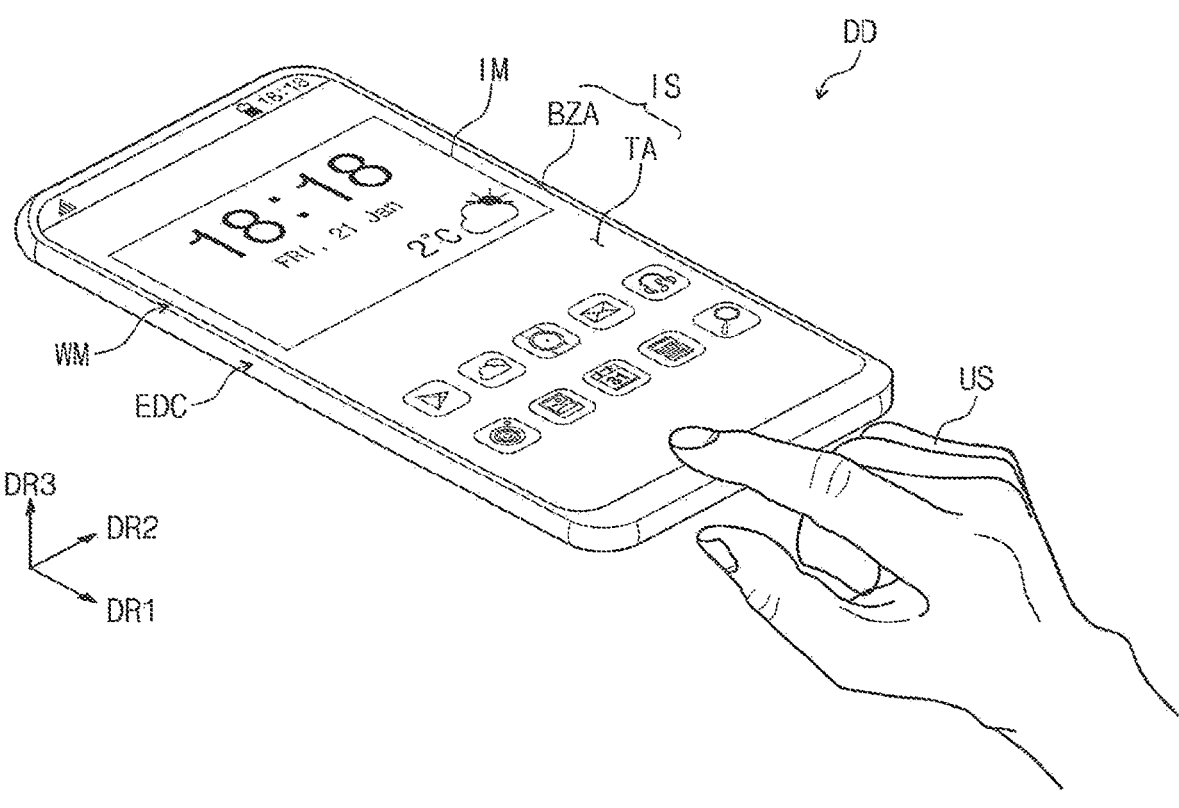
FIG. 1 is a perspective view of a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. These terms are relative concepts, and are described based on the directions illustrated in the drawing. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
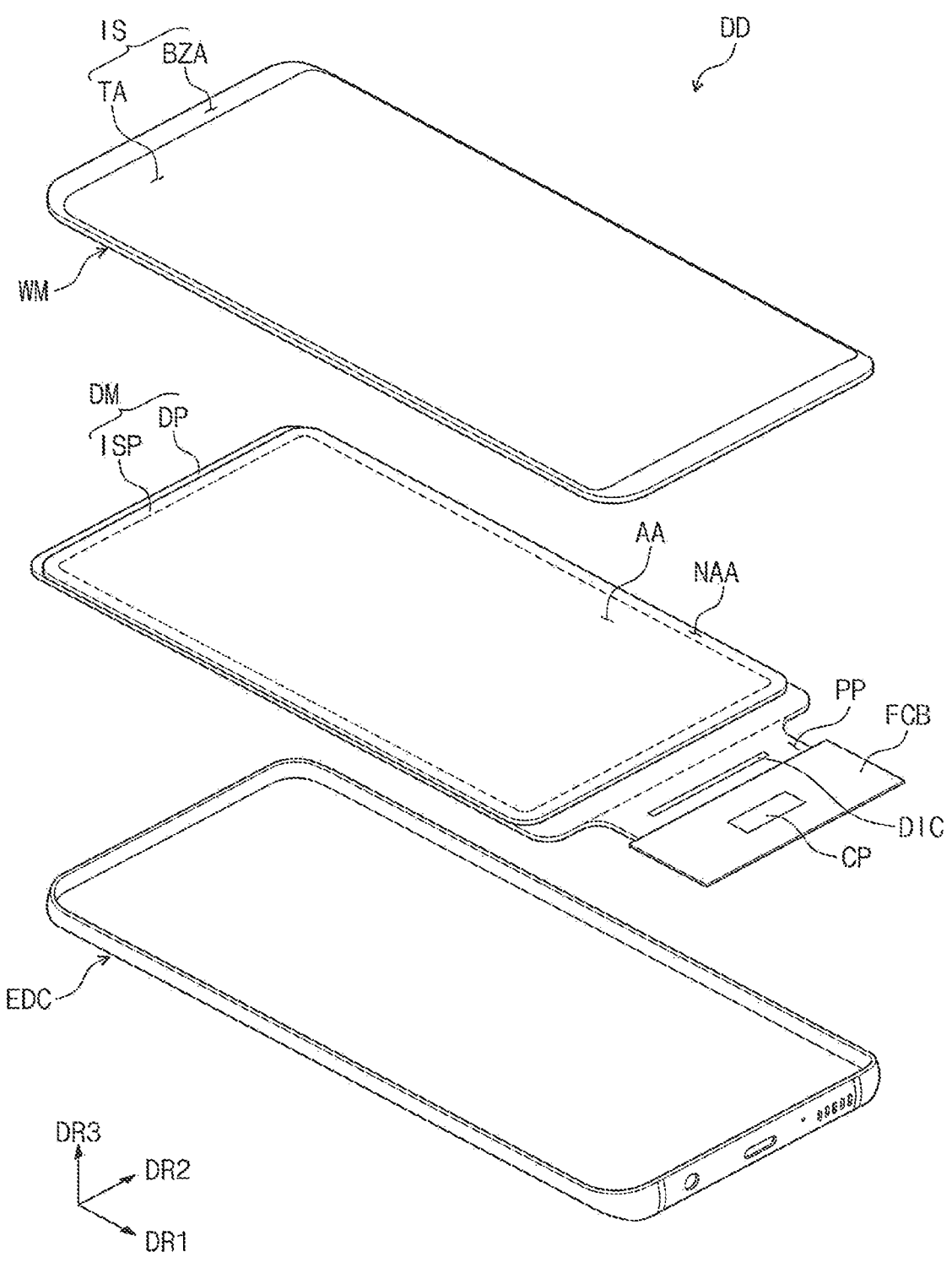
FIG. 2 is an exploded perspective view of the display device according to an embodiment of the present disclosure.

FIG. 1 is a perspective view of a display device according to an embodiment of the present disclosure, and FIG. 2 is an exploded perspective view of the display device according to an embodiment of the present disclosure.

Referring to FIG. 1, the display device DD may be a device activated in response to an electrical signal. In FIGS. 1 and 2, the display device DD is illustrated as a smart phone. However, the present disclosure is not limited thereto, and the display device DD may be a large display device, such as a television, a monitor, or the like, or may be a small and/or medium-sized display device, such as a tablet computer, a notebook computer, a car navigation unit (e.g., a car navigation device), a game machine, or the like. However, these devices are merely illustrative of the display device DD, and the display device DD may be implemented with various other suitable forms of display devices, as long as the display devices do not deviate from the spirit and scope of the present disclosure.

The display device DD has a rounded rectangular shape with long sides extending in a first direction DR1, and short sides extending in a second direction DR2 crossing the first direction DR1. However, the present disclosure is not limited thereto, and the display device DD may have various suitable shapes (e.g., a circular shape, an oval shape, or the like). The display device DD may display an image IM in a third direction DR3, which may be parallel to or substantially parallel to the first direction DR1 and the second direction DR2, at (e.g., in or on) a display surface IS. The display surface IS at (e.g., in or on) which the image IM is displayed may correspond to a front surface of the display device DD.

In the present embodiment, front surfaces (e.g., upper surfaces) and rear surfaces (e.g., lower surfaces) of various members and elements are defined based on the direction in which the image IM is displayed. The front surfaces and the rear surfaces may be opposite to each other in the third direction DR3, and the normal directions of the front surfaces and the rear surfaces may be parallel to or substantially parallel to the third direction DR3.

A separation distance between the front surface and the rear surface of the display device DD in the third direction DR3 may correspond to the thickness of the display device DD in the third direction DR3. However, the directions indicated by the first, second, and third directions DR1, DR2, and DR3 may be relative concepts, and may be variously modified to other suitable different directions as needed or desired.

The display device DD may sense an external input applied from the outside. The external input may include various suitable forms of inputs provided from outside of the display device DD. The external input may be one of various suitable forms of external inputs, such as a part of a user's body (e.g., a finger), light, heat, pressure, and/or a suitable combination thereof. In the present embodiment, for convenience of illustration and description, the external input is described in the context of a touch by a hand (e.g., a finger) of a user US on the front surface of the display device DD.

However, the present disclosure is not limited thereto, and the external input may be provided in various suitable forms as described above. Furthermore, the display device DD may sense an external input of the user US applied to a side surface or the rear surface of the display device DD depending on a structure of the display device DD, but is not particularly limited thereto. The display device DD may sense a position (e.g., coordinate information) of the external input.

An external input according to an embodiment of the present disclosure may further include an input by an input device (e.g., a stylus pen, an active pen, a touch pen, an electronic pen, an e-pen, or the like), in addition to, or in lieu of, the hand of the user US.

The display surface IS of the display device DD may be divided into a transmissive area TA and a bezel area BZA. The transmissive area TA may be an area at (e.g., in or on) which the image IM is displayed. The image IM may be visible to the user US through the transmissive area TA. In the present embodiment, the transmissive area TA is illustrated as having a rounded rectangular shape. However, the present disclosure is not limited thereto, and the transmissive area TA may have various suitable shapes, and thus, is not limited to any one particular shape.

The bezel area BZA is adjacent to the transmissive area TA. The bezel area BZA may have a suitable color (e.g., a predetermined color). The bezel area BZA may surround (e.g., around a periphery of) the transmissive area TA. Accordingly, the shape of the transmissive area TA may be substantially defined by the bezel area BZA. However, the present disclosure is not limited thereto, and the bezel area BZA may be disposed to be adjacent to only one side of the transmissive area TA, or may be omitted as needed or desired. The display device DD according to an embodiment of the present disclosure may include various suitable embodiments, and thus, is not limited to any one embodiment.

As illustrated in FIG. 2, the display device DD may include a window WM, a display module (e.g., a display layer) DM, and an outer case EDC. The display module DM may include a display panel DP that displays the image IM in response to an electrical signal, and an input sensing layer ISP that transmits/receives information about an external input (e.g., refer to FIG. 1).

The window WM protects the upper surface of the display module DM. The window WM may be optically transparent. The window WM may be formed of a transparent material, such that the image IM may be output (e.g., may be viewed) through the window WM. For example, the window WM may be formed of glass, sapphire, plastic, or the like. Although the window WM is illustrated as a single layer for convenience of illustration, the window WM may include a plurality of layers.

The bezel area BZA of the display device DD may be formed by printing a material having a suitable color (e.g., a predetermined color) on one area or substantially one area of the window WM. In an embodiment of the present disclosure, the window WM may include a light blocking pattern for defining the bezel area BZA. The light blocking pattern may be a colored organic film. For example, the light blocking pattern may be formed by coating.

The window WM may be coupled to (e.g., connected to or attached to) the display module DM through an adhesive film. In an embodiment of the present disclosure, the adhesive film may include an optically clear adhesive (OCA) film. However, the present disclosure is not limited thereto, and the adhesive film may include a conventional adhesive or sticky material. For example, the adhesive film may include an optically clear resin (OCR) or a pressure sensitive adhesive (PSA) film.

An anti-reflection layer may be additionally disposed between the window WM and the display module DM. The anti-reflection layer decreases a reflectivity of external light incident from above the window WM. The anti-reflection layer according to an embodiment of the present disclosure may include a phase retarder and a polarizer. The phase retarder may be of a film type or a liquid crystal coating type, and may include a $\lambda/2$ phase retarder and/or a $\lambda/4$ phase retarder. The polarizer may also be of a film type or a liquid crystal coating type. The film type may include a stretchable synthetic resin film, and the liquid crystal coating type may include liquid crystals arranged in a suitable arrangement (e.g., a predetermined arrangement). The phase retarder and the polarizer may be implemented with one polarizer film.

In an embodiment of the present disclosure, the anti-reflection layer may include color filters. The arrangement of the color filters may be determined in consideration of the colors of light generated by a plurality of pixels included in the display panel DP. The anti-reflection layer may further include a light blocking pattern.

The display module DM may display an image in response to an electrical signal, and may transmit/receive information about an external input. The display module DM may have an effective area AA and an ineffective area NAA defined therein. The effective area AA may be defined as an area where the image IM is displayed from the display panel DP. Furthermore, the effective area AA may be defined as an area where the input sensing layer ISP senses an external input. However, the present disclosure is not limited thereto, and the area where the image IM is displayed from the display panel DP and the area where the input sensing layer ISP senses the external input may be different from each other.

The ineffective area NAA is adjacent to the effective area AA. For example, the ineffective area NAA may surround (e.g., around a periphery of) the effective area AA. However, the present disclosure is not limited thereto, and the ineffective area NAA may be defined in various suitable shapes, and is not limited to any one particular shape. For example, the ineffective area NAA may be provided to be adjacent to one side of the effective area AA, or to two sides thereof. According to an embodiment, the effective area AA of the display module DM may correspond to at least a portion of the transmissive area TA, and the ineffective area NAA may correspond to at least a portion of the bezel area BZA.

The display panel DP according to an embodiment of the present disclosure may be an emissive display panel. For example, the display panel DP may be an organic light emitting display panel, an inorganic light emitting display panel, or a quantum-dot light emitting display panel. An emissive layer of the organic light emitting display panel may contain an organic light emitting material. An emissive layer of the inorganic light emitting display panel may contain an inorganic light emitting material. An emissive layer of the quantum-dot light emitting display panel may contain quantum dots, quantum rods, and/or the like. Hereinafter, for convenience of illustration and description, the display panel DP will be described in more detail in the context of an organic light emitting display panel.

The input sensing layer ISP may be disposed on the display panel DP, and may sense the external input. The input sensing layer ISP may be directly disposed on the display panel DP. According to an embodiment of the present disclosure, the input sensing layer ISP may be formed on the display panel DP by a continuous process. In other words, when the input sensing layer ISP is directly disposed on the display panel DP, an adhesive film may not be disposed between the input sensing layer ISP and the display panel DP. However, the present disclosure is not limited thereto, and an adhesive film may be disposed between the input sensing layer ISP and the display panel DP. In this case, the input sensing layer ISP may not be manufactured together with the display panel DP by the continuous process, and may be manufactured separately from the display panel DP and then fixed to the upper surface of the display panel DP by the adhesive film.

In an embodiment of the present disclosure, the display device DD may further include a driver integrated circuit (IC) DIC, a controller CP, and a flexible circuit film FCB. In an embodiment of the present disclosure, the display panel DP may further include a pad area PP extending from the ineffective area NAA.

The driver IC DIC and pads may be disposed at (e.g., in or on) the pad area PP. However, the present disclosure is not limited thereto. As another example, the driver IC DIC may be mounted on the flexible circuit film FCB. The display panel DP may be electrically connected with the flexible circuit film FCB through the pads. In an embodiment of the present disclosure, the controller CP may be mounted on the flexible circuit film FCB. The flexible circuit film FCB may include a plurality of drive elements. The plurality of drive elements may include a circuit unit (e.g., a circuit) for driving the display panel DP. In an embodiment of the present disclosure, the pad area PP may be bent, and may be disposed on the rear surface of the display panel DP.

The outer case EDC may be coupled with (e.g., connected to or attached to) the window WM, and may define the exterior of the display device DD. The outer case EDC protects components accommodated therein by absorbing shocks applied from the outside, and may prevent or substantially prevent infiltration of foreign matter/moisture into the display module DM. In an embodiment of the present disclosure, the outer case EDC may be provided in a form in which a plurality of receiving members are combined with one another.

The display device DD according to an embodiment may further include an electronic module (e.g., an electronic device or an electronic sensor) including various suitable functional modules for operating the display module DM, a power supply module (e.g., a power supply) that supplies power used for the overall operation of the display device DD, and a bracket that is coupled with (e.g., connected to or attached to) the outer case EDC and divides an inner space of the display device DD.

Figure 3:
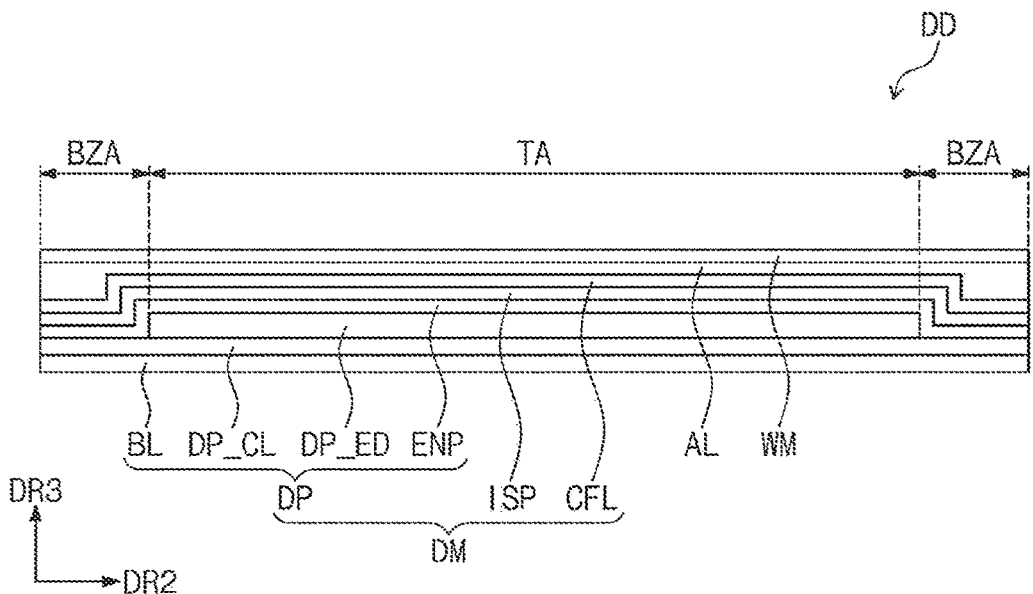
FIG. 3 is a cross-sectional view of the display device according to an embodiment of the present disclosure.

FIG. 3 is a cross-sectional view of the display device according to an embodiment of the present disclosure.

Referring to FIGS. 2 and 3, the display panel DP includes a base layer BL, a circuit layer DP_CL, an element layer DP_ED, and an encapsulation layer ENP. The display panel DP according to one or more embodiments of the present disclosure may be a flexible display panel. However, the present disclosure is not limited thereto. For example, the display panel DP may be a foldable display panel that is foldable about a folding axis, or a rigid display panel.

The base layer BL may include a synthetic resin layer. The synthetic resin layer may be a polyimide-based resin layer, but a material thereof is not particularly limited. In addition, the base layer BL may include a glass substrate, a metal substrate, or an organic/inorganic composite substrate.

The circuit layer DP_CL is disposed between the base layer BL and the element layer DP_ED. The circuit layer DP_CL includes at least one insulating layer and at least one circuit element. Hereinafter, the insulating layer included in the circuit layer DP_CL is referred to as the intermediate insulating layer. The intermediate insulating layer includes at least one intermediate inorganic film and at least one intermediate organic film. The circuit element may include a pixel drive circuit PDC (e.g., refer to FIG. 6) for (e.g., included in) each of a plurality of pixels PX (e.g., refer to FIG. 5) for displaying the image IM, and a sensor drive circuit SDC (e.g., refer to FIG. 6) for (e.g., included in) each of a plurality of light receiving sensors FX (e.g., refer to FIG. 5) for recognizing external information. The external information may be biometric information of the user US. In an embodiment of the present disclosure, the light receiving sensors FX may include a fingerprint recognition sensor, a proximity sensor, an iris recognition sensor, and/or the like. Furthermore, the light receiving sensors FX may include an optical sensor for recognizing biometric information.

The circuit layer DP_CL may further include signal lines connected to the pixel drive circuit PDC and/or the sensor drive circuit SDC.

The element layer DP_ED may include a light emitting element ED (e.g., refer to FIG. 6) for (e.g., included in) each of the pixels PX, and a light receiving element OPD (e.g., refer to FIG. 6) for (e.g., included in) each of the light receiving sensors FX. The light receiving element OPD may be a sensor that reacts to light reflected by the body of the user US, or light passing through the body of the user US. For example, in an embodiment of the present disclosure, the light receiving element OPD may be a photo diode. The circuit layer DP_CL and the element layer DP_ED will be described in more detail below with reference to FIGS. 6 and 7A.

The encapsulation layer ENP seals the element layer DP_ED. The encapsulation layer ENP may include at least one organic film and at least one inorganic film. The inorganic film may contain an inorganic material, and may protect the element layer DP_ED from moisture/oxygen. The inorganic film may include a silicon nitride (SiNw) layer, a silicon oxy-nitride (SiON) layer, a silicon oxide (SiOx) layer, a titanium oxide (TiOy) layer, or an aluminum oxide (AlOz) layer, but is not particularly limited thereto. The organic film may contain an organic material, and may protect the element layer DP_ED from foreign matter such as dust particles.

The input sensing layer ISP may be formed on the display panel DP. The input sensing layer ISP may sense an external input (e.g., a touch of the user US), may change the external input to a suitable input signal (e.g., a predetermined input signal), and may provide the input signal to the display panel DP. The input sensing layer ISP may include a plurality of sensing electrodes for sensing the external input. The sensing electrodes may sense the external input in a capacitive manner. The display panel DP may receive the input signal from the input sensing layer ISP, and may generate an image corresponding to the input signal.

The display module DM may further include a color filter layer CFL. In an embodiment of the present disclosure, the color filter layer CFL may be disposed on the input sensing layer ISP. However, the present disclosure is not limited thereto, and the color filter layer CFL may be disposed between the display panel DP and the input sensing layer ISP. The color filter layer CFL may include color filters CF and a light blocking layer BM (e.g., refer to FIG. 7A).

The display device DD according to an embodiment of the present disclosure may further include an adhesive layer AL. The window WM may be attached to the input sensing layer ISP by the adhesive layer AL. The adhesive layer AL may include an optically clear adhesive, an optically clear adhesive resin, or a pressure sensitive adhesive (PSA). In an embodiment of the present disclosure, when the display module DM includes the color filter layer CFL, the window WM may be attached to the input sensing layer ISP by the adhesive layer AL.

The display surface IS of the display device DD may be divided into the transmissive area TA and the bezel area BZA. The transmissive area TA may be an area where the image IM is displayed. The image IM may be visible to the user US through the transmissive area TA. The bezel area BZA of the display device DD may be formed by printing a material having a suitable color (e.g., a predetermined color) on one area or substantially one area of the window WM.

Figure 4:
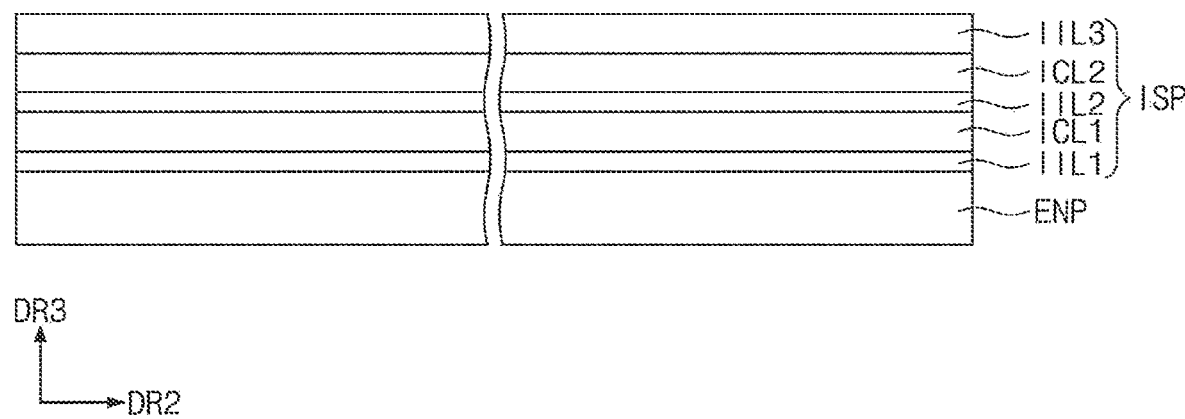
FIG. 4 is a cross-sectional view illustrating a configuration of an input sensing layer according to an embodiment of the present disclosure.

FIG. 4 is a cross-sectional view illustrating a configuration of the input sensing layer according to an embodiment of the present disclosure.

Referring to FIG. 4, the input sensing layer ISP according to an embodiment of the present disclosure may include a first sensing insulation layer IIL1, a first conductive layer ICL1, a second sensing insulation layer IIL2, a second conductive layer ICL2, and a third sensing insulation layer IIL3. The first sensing insulation layer IIL1 may be directly disposed on the encapsulation layer ENP. However, in another embodiment of the present disclosure, the first sensing insulation layer IIL1 may be omitted as needed or desired.

Each of the first conductive layer ICL1 and the second conductive layer ICL2 includes a plurality of conductive patterns. The conductive patterns may include a plurality of sensing electrodes, and a plurality of signal lines connected to the sensing electrodes.

Each of the first sensing insulation layer IIL1, the second sensing insulation layer IIL2, and the third sensing insulation layer IIL3 may contain an inorganic material or an organic material. In the present embodiment, the first sensing insulation layer IIL1 and the second sensing insulation layer IIL2 may be inorganic layers. The inorganic layers may contain at least one of aluminum oxide (AlOz), titanium oxide (TiOy), silicon oxide (SiOx), silicon oxy-nitride (SiON), zirconium oxide (ZrOa), or hafnium oxide (HfOb). The inorganic layers may have a thickness of about 1000 Å to about 4000 Å.

The third sensing insulation layer IIL3 may be an organic layer. The organic layer may contain at least one of an acrylate-based resin, a methacrylate-based resin, a polyisoprene-based resin, a vinyl-based resin, an epoxy-based resin, a urethane-based resin, a celluose-based resin, a siloxane-based resin, a polyimide-based resin, a polyamide-based resin, or a perylene-based resin. The third sensing insulation layer IIL3 containing an organic material may prevent or substantially prevent infiltration of moisture from the outside into the first conductive layer ICL1 and the second conductive layer ICL2.

The sensing electrodes may include a plurality of transmitter electrodes and a plurality of receiver electrodes. The input sensing layer ISP may obtain coordinate information in a mutual-cap manner. A capacitor is formed between the transmitter electrodes and the receiver electrodes. The capacitance of the capacitor may be changed by an external input. Here, the sensing sensitivity of the input sensing layer ISP may be determined depending on the amount of change in the capacitance.

Figure 5:
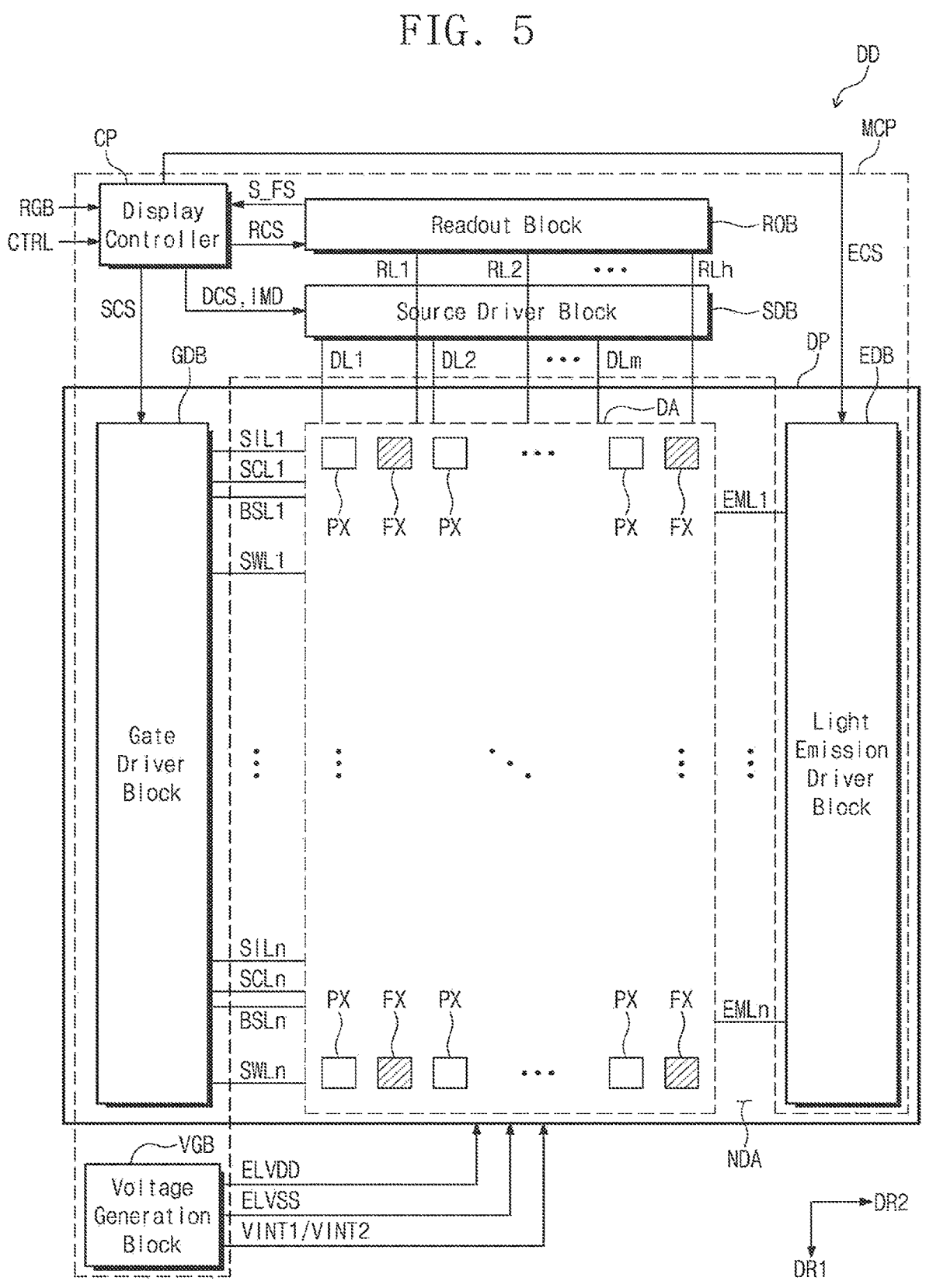
FIG. 5 is a block diagram of the display device according to an embodiment of the present disclosure.

FIG. 5 is a block diagram of the display device according to an embodiment of the present disclosure.

Referring to FIG. 5, the display device DD includes the display panel DP and a control module (e.g., a control circuit) MCP. In an embodiment of the present disclosure, the control module MCP includes the controller CP, a source driver block SDB, a gate driver block GDB, a light emission driver block EDB, a voltage generation block VGB, and a readout block ROB.

The controller CP receives an image signal RGB and an external control signal CTRL. The controller CP generates an image data signal IMD by converting a data format of the image signal RGB according to an interface specification of the source driver block SDB. The controller CP outputs a gate drive signal SCS, a source drive signal DCS, a light emission control signal ECS, and a read control signal RCS, based on the external control signal CTRL.

The source driver block SDB receives the source drive signal DCS and the image data signal IMD from the controller CP. The source driver block SDB converts the image data signal IMD into data signals, and outputs the data signals to a plurality of data lines DL1 to DLm described in more detail below, where m is a natural number. The data signals are analog voltages corresponding to gray scale values of the image data signal IMD.

The gate driver block GDB receives the gate drive signal SCS from the controller CP. In response to the gate drive signal SCS, the gate driver block GDB may output scan signals to a plurality of scan lines described in more detail below.

The voltage generation block VGB generates voltages used for the operation of the display panel DP. In the present embodiment, the voltage generation block VGB generates a first drive voltage ELVDD, a second drive voltage ELVSS, a first initialization voltage VINT1, and a second initialization voltage VINT2. In an embodiment of the present disclosure, the voltage generation block VGB may operate under the control of the controller CP. In an embodiment of the present disclosure, a voltage level of the first drive voltage ELVDD is higher than a voltage level of the second drive voltage ELVSS. Voltage levels of the first and second initialization voltages VINT1 and VINT2 are lower than the voltage level of the second drive voltage ELVSS. However, the present disclosure is not limited thereto, and the relationship between the voltage levels of the first drive voltage ELVDD, the second drive voltage ELVSS, and the first and second initialization voltages VINT1 and VINT2, which are generated by the voltage generation block VGB, may be variously modified depending on the shapes of the display device DD and the display panel DP.

The display panel DP may include a display area DA corresponding to the transmissive area TA, and a non-display area corresponding to the bezel area BZA (e.g., refer to FIG. 1).

The display panel DP may include the plurality of pixels PX disposed at (e.g., in or on) the display area DA, and the plurality of light receiving sensors FX disposed at (e.g., in or on) the display area DA. In an embodiment of the present disclosure, each of the plurality of light receiving sensors FX may be disposed between two corresponding pixels PX that are adjacent to each other. The plurality of pixels PX and the plurality of light receiving sensors FX may be alternately disposed in the first and second directions DR1 and DR2. However, the present disclosure is not limited thereto. In other words, in some embodiments, two or more pixels PX may be disposed between two light receiving sensors FX that are adjacent to each other in the first direction DR1 from among the plurality of light receiving sensors FX, or two or more pixels PX may be disposed between two light receiving sensors FX that are adjacent to each other in the second direction DR2 from among the plurality of light receiving sensors FX.

The display panel DP further includes a plurality of initialization scan lines SIL1 to SILn, a plurality of compensation scan lines SCL1 to SCLn, a plurality of write scan lines SWL1 to SWLn, a plurality of black scan lines BSL1 to BSLn, a plurality of light emission control lines EML1 to EMLn, the plurality of data lines DL1 to DLm, and a plurality of sensing lines RL1 to RLh, where n and h are natural numbers. The initialization scan lines SIL1 to SILn, the compensation scan lines SCL1 to SCLn, the write scan lines SWL1 to SWLn, the black scan lines BSL1 to BSLn, and the light emission control lines EML1 to EMLn extend in the second direction DR2. The initialization scan lines SIL1 to SILn, the compensation scan lines SCL1 to SCLn, the write scan lines SWL1 to SWLn, the black scan lines BSL1 to BSLn, and the light emission control lines EML1 to EMLn are arranged along the first direction DR1, so as to be spaced apart from each other. The data lines DL1 to DLm and the sensing lines RL1 to RLh extend in the first direction DR1, and are arranged along the second direction DR2, so as to be spaced apart from each other.

Each of the plurality of pixels PX are electrically connected to a corresponding one of the initialization scan lines SIL1 to SILn, a corresponding one of the compensation scan lines SCL1 to SCLn, a corresponding one of the write scan lines SWL1 to SWLn, a corresponding one of the black scan lines BSL1 to BSLn, a corresponding one of the light emission control lines EML1 to EMLn, and a corresponding one of the data lines DL1 to DLm. For example, each of the plurality of pixels PX may be electrically connected to four scan lines. However, the number of scan lines connected to each pixel PX may be variously modified and are not particularly limited thereto.

Each of the plurality of light receiving sensors FX are electrically connected to a corresponding one of the write scan lines SWL1 to SWLn and a corresponding one of the sensing lines RL1 to RLh. However, the present disclosure is not limited thereto. The number of lines connected to each light receiving sensor FX may be variously modified. In an embodiment of the present disclosure, the number of sensing lines RL1 to RLh may correspond to ½ of the number of data lines DL1 to DLm. However, the present disclosure is not limited thereto. As another example, the number of sensing lines RL1 to RLh may correspond to ¼ or ⅛ of the number of data lines DL1 to DLm.

The gate driver block GDB may be disposed at (e.g., in or on) the non-display area NDA of the display panel DP. The gate driver block GDB receives the gate drive signal SCS from the controller CP. In response to the gate drive signal SCS, the gate driver block GDB outputs initialization scan signals to the initialization scan lines SIL1 to SILn, and compensation scan signals to the compensation scan lines SCL1 to SCLn. In an embodiment of the present disclosure, the gate driver block GDB may sequentially supply the initialization scan signals to the initialization scan lines SIL1 to SILn, and may sequentially supply the compensation scan signals to the compensation scan lines SCL1 to SCLn. Furthermore, in response to the gate drive signal SCS, the gate driver block GDB may output write scan signals to the write scan lines SWL1 to SWLn, and black scan signals to the black scan lines BSL1 to BSLn. In an embodiment of the present disclosure, the gate driver block GDB may sequentially supply the write scan signals to the write scan lines SWL1 to SWLn, and may sequentially supply the black scan signals to the black scan lines BSL1 to BSLn.

As another example, the gate driver block GDB may include a first gate driver block and a second gate driver block. The first gate driver block may output the initialization scan signals and the compensation scan signals, and the second gate driver block may output the write scan signals and the black scan signals.

The light emission driver block EDB may be disposed at (e.g., in or on) the non-display area NDA of the display panel DP. The light emission driver block EDB receives the light emission control signal ECS from the controller CP. In response to the light emission control signal ECS, the light emission driver block EDB may output light emission control signals to the light emission control lines EML1 to EMLn. As another example, the gate driver block GDB may be connected to the light emission control lines EML1 to EMLn. In this case, the light emission driver block EDB may be omitted, and the gate driver block GDB may output the light emission control signals to the light emission control lines EML1 to EMLn.

The readout block ROB receives the read control signal RCS from the controller CP. In response to the read control signal RCS, the readout block ROB may receive sensing signals from the sensing lines RL1 to RLh. The readout block ROB provides the received sensing signals to the controller CP. The controller CP calculates biometric information of the user US based on the sensing signals.

Figure 6:
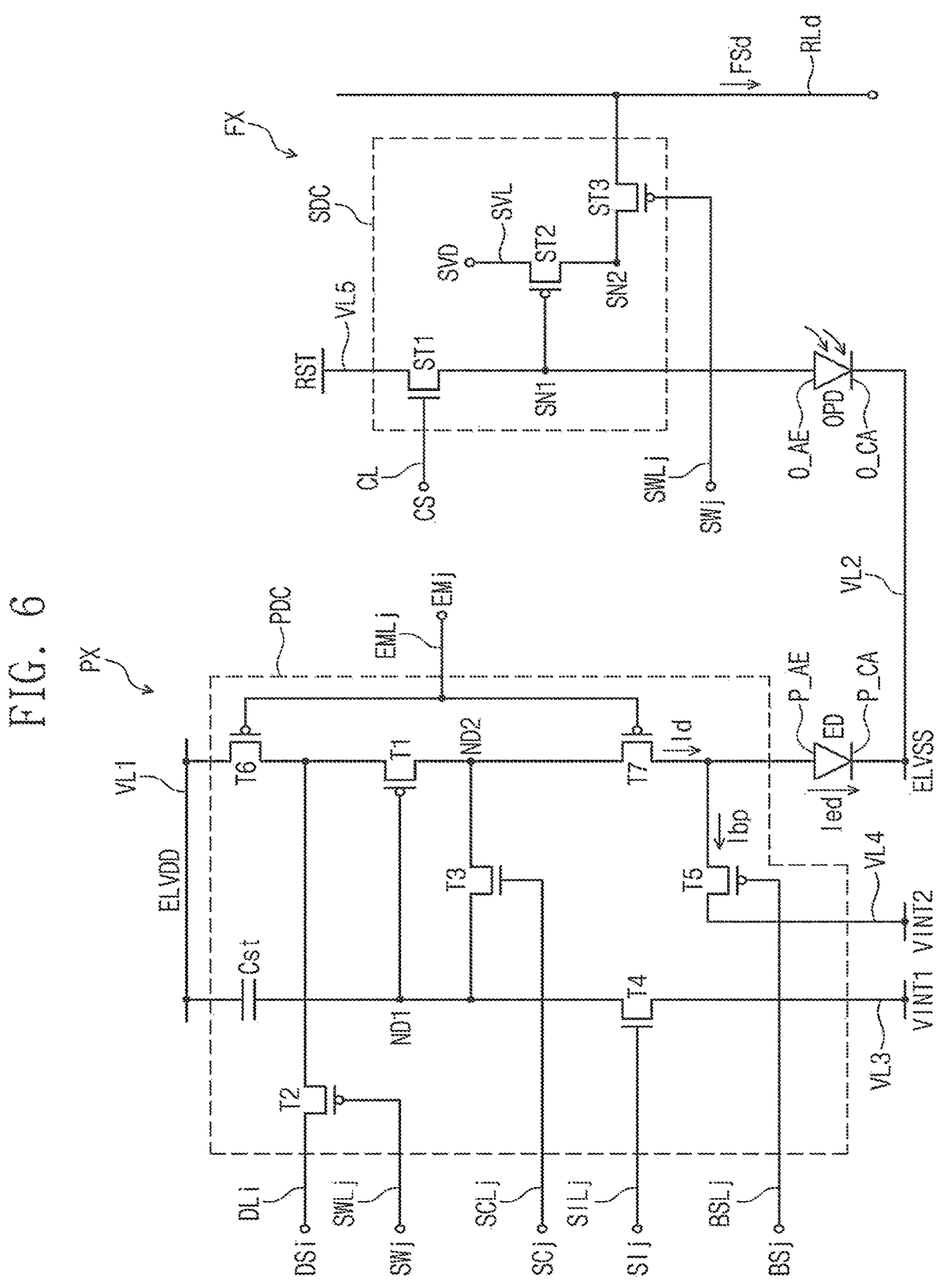
FIG. 6 is a circuit diagram illustrating a pixel and a light receiving sensor of a display panel according to an embodiment of the present disclosure.

FIG. 6 is a circuit diagram illustrating a pixel and a light receiving sensor of the display panel according to an embodiment of the present disclosure.

In FIG. 6, an equivalent circuit diagram of one pixel PX from among the plurality of pixels PX illustrated in FIG. 5 is illustrated. As the plurality of pixels PX have the same or substantially the same circuit structure as each other, description of the circuit structure for the pixel PX may be applied to the other remaining pixels PX, and thus, redundant description of the other remaining pixels PX may not be repeated.

Furthermore, in FIG. 6, an equivalent circuit diagram of one light receiving sensor FX from among the plurality of light receiving sensors FX illustrated in FIG. 5 is illustrated. As the plurality of light receiving sensors FX have the same or substantially the same circuit structure as each other, description of the circuit structure for the light receiving sensor FX may be applied to the other remaining light receiving sensors FX, and thus, redundant description of the other remaining light receiving sensors FX may not be repeated.

Referring to FIG. 6, the pixel PX is connected to an $i^{th}$ data line DLi from among the data lines DL1 to DLm, a $j^{th}$ initialization scan line SILj from among the initialization scan lines SIL1 to SILn, a $j^{th}$ compensation scan line SCLj from among the compensation scan lines SCL1 to SCLn, a $j^{th}$ write scan line SWLj from among the write scan lines SWL1 to SWLn, a $j^{th}$ black scan line BSLj from among the black scan lines BSL1 to BSLn, and a $j^{th}$ light emission control line EMLj from among the light emission control lines EML1 to EMLn, where i and j are each natural numbers.

The pixel PX includes the light emitting element ED, and the pixel drive circuit PDC. The light emitting element ED may be a light emitting diode. In an embodiment of the present disclosure, the light emitting element ED may be an organic light emitting diode including an organic light emitting layer.

The pixel drive circuit PDC includes first to seventh transistors T1, T2, T3, T4, T5, T6, and T7, and one capacitor Cst. At least one of the first to seventh transistors T1, T2, T3, T4, T5, T6, and T7 may be a transistor having a low-temperature polycrystalline silicon (LTPS) semiconductor layer. At least one of the first to seventh transistors T1, T2, T3, T4, T5, T6, and T7 may be a transistor having an oxide semiconductor layer. Some of the first to seventh transistors T1, T2, T3, T4, T5, T6, and T7 may be P-type transistors, and the others may be N-type transistors. For example, the first, second, fifth, sixth, and seventh transistors T1, T2, T5, T6, and T7 may be PMOS transistors, and the third and fourth transistors T3 and T4 may be NMOS transistors. For example, the third and fourth transistors T3 and T4 may be oxide semiconductor transistors, and the first, second, fifth, sixth, and seventh transistors T1, T2, T5, T6, and T7 may be LTPS transistors.

A configuration of the pixel drive circuit PDC according to one or more embodiments of the present disclosure are not limited to the embodiment illustrated in FIG. 6. The pixel drive circuit PDC illustrated in FIG. 6 is merely illustrative, and various changes and modifications may be made to the configuration of the pixel drive circuit PDC. For example, the first to seventh transistors T1, T2, T3, T4, T5, T6, and T7 may all be P-type transistors or N-type transistors.

The $j^{th}$ initialization scan line SILj, the $j^{th}$ compensation scan line SCLj, the $j^{th}$ write scan line SWLj, the $j^{th}$ black scan line BSLj, and the $j^{th}$ light emission control line EMLj may transfer a $j^{th}$ initialization scan signal SIj, a $j^{th}$ compensation scan signal SCj, a $j^{th}$ write scan signal SWj, a $j^{th}$ black scan signal BSj, and a $j^{th}$ light emission control signal EMj to the pixel PX. The $i^{th}$ data line DLi transfers a $i^{th}$ data signal DSi to the pixel PX. The $i^{th}$ data signal DSi may have a voltage level corresponding to the image signal RGB that is input to the display device DD (e.g., refer to FIG. 5).

A first drive voltage line VL1 and a second drive voltage line VL2 may transfer the first drive voltage ELVDD and the second drive voltage ELVSS to the pixel PX. Furthermore, a first initialization voltage line VL3 and a second initialization voltage line VL4 may transfer the first initialization voltage VINT1 and the second initialization voltage VINT2 to the pixel PX.

The first transistor T1 is connected between the first drive voltage line VL1 for receiving the first drive voltage ELVDD and the light emitting element ED. The first transistor T1 includes a first electrode connected with the first drive voltage line VL1 via the sixth transistor T6, a second electrode connected with an anode electrode P_AE of the light emitting element ED via the seventh transistor T7, and a third electrode connected with one end of the capacitor Cst (e.g., via a first node ND1). The first transistor T1 may receive the $i^{th}$ data signal DSi transferred from the $i^{th}$ data line DLi depending on a switching operation of the second transistor T2, and may supply a drive current Id to the light emitting element ED.

The second transistor T2 is connected between the $i^{th}$ data line DLi and the first electrode of the first transistor T1. The second transistor T2 includes a first electrode connected with the $i^{th}$ data line DLi, a second electrode connected with the first electrode of the first transistor T1, and a third electrode connected with the $j^{th}$ write scan line SWLj. The second transistor T2 may be turned on in response to the write scan signal SWj transferred through the $j^{th}$ write scan line SWLj, and may transfer, to the first electrode of the first transistor T1, the $i^{th}$ data signal DSi transferred from the $i^{th}$ data line DLi.

The third transistor T3 is connected between the second electrode of the first transistor T1 and the first node ND1. The third transistor T3 includes a first electrode connected with the third electrode of the first transistor T1, a second electrode connected with the second electrode of the first transistor T1, and a third electrode connected with the $j^{th}$ compensation scan line SCLj. The third transistor T3 may be turned on in response to the $j^{th}$ compensation scan signal SCj transferred through the $j^{th}$ compensation scan line SCLj, and may diode-connect the first transistor T1 by connecting the third electrode and the second electrode of the first transistor T1 to each other.

The fourth transistor T4 is connected between the first initialization voltage line VL3 to which the first initialization voltage VINT1 is applied and the first node ND1. The fourth transistor T4 includes a first electrode connected with the first initialization voltage line VL3, a second electrode connected with the first node ND1, and a third electrode connected with the $j^{th}$ initialization scan line SILj. The fourth transistor T4 is turned on in response to the $j^{th}$ initialization scan signal SIj transferred through the $j^{th}$ initialization scan line SILj. The turned-on fourth transistor T4 initializes a potential of the third electrode of the first transistor T1 (or in other words, initializes the potential of the first node ND1) by transferring the first initialization voltage VINT1 to the first node ND1.

The sixth transistor T6 includes a first electrode connected with the first drive voltage line VL1, a second electrode connected with the first electrode of the first transistor T1, and a third electrode connected to the $j^{th}$ light emission control line EMLj.

The seventh transistor T7 includes a first electrode connected with the second electrode of the first transistor T1, a second electrode connected to the anode electrode P_AE of the light emitting element ED, and a third electrode connected to the $j^{th}$ light emission control line EMLj.

The sixth and seventh transistors T6 and T7 are concurrently (e.g., simultaneously or substantially simultaneously) turned on in response to the $j^{th}$ light emission control signal EMj transferred through the $j^{th}$ light emission control line EMLj. The first drive voltage ELVDD applied through the turned-on sixth transistor T6 may be compensated for through the diode-connected first transistor T1, and may be transferred to the light emitting element ED.

The fifth transistor T5 includes a first electrode connected to the second initialization voltage line VL4 to which the second initialization voltage VINT2 is applied, a second electrode connected with the second electrode of the seventh transistor T7, and a third electrode connected with the $j^{th}$ black scan line BSLj. The second initialization voltage VINT2 may have a voltage level lower than or equal to the voltage level of the first initialization voltage VINT1.

The one end of the capacitor Cst is connected with the third electrode of the first transistor T1 as described above, and an opposite end of the capacitor Cst is connected with the first drive voltage line VL1.

A cathode electrode P_CA of the light emitting element ED may be connected with the second drive voltage line VL2 that transfers the second drive voltage ELVSS. The second drive voltage ELVSS may have a lower voltage level than that of the first drive voltage ELVDD. In an embodiment of the present disclosure, the second drive voltage ELVSS may have a lower voltage level than those of the first and second initialization voltages VINT1 and VINT2.

In an embodiment of the present disclosure, the $j^{th}$ light emission control signal EMj includes a light emitting period and a non-light emitting period within one drive frame of the display panel DP (e.g., refer to FIG. 5). The $j^{th}$ light emission control signal EMj has a high level during the non-light emitting period. Within the non-light emitting period, the $j^{th}$ initialization scan signal SIj is activated. When the $j^{th}$ initialization scan signal SIj having a high level is provided through the $j^{th}$ initialization scan line SILj during an activation period of the $j^{th}$ initialization scan signal SIj (hereinafter, referred to as a first activation period), the fourth transistor T4 is turned on in response to the $j^{th}$ initialization scan signal SIj having the high level. The first initialization voltage VINT1 is transferred to the third electrode of the first transistor T1 through the turned-on fourth transistor T4, and the first node ND1 is initialized to the first initialization voltage VINT1. Accordingly, the first activation period may be defined as an initialization period of the pixel PX.

Next, the $j^{th}$ compensation scan signal SCj is activated, and when the $j^{th}$ compensation scan signal SCj having a high level is supplied through the $j^{th}$ compensation scan line SCLj during an activation period of the $j^{th}$ compensation scan signal SCj (hereinafter, referred to as a second activation period), the third transistor T3 is turned on. The first transistor T1 is diode-connected by the turned-on third transistor T3 and is forward-biased. The first activation period may not overlap with the second activation period.

Within the second activation period, the $j^{th}$ write scan signal SWj is activated. The $j^{th}$ write scan signal SWj has a low level during an activation period (hereinafter, referred to as a fourth activation period). During the fourth activation period, the second transistor T2 is turned on by the $j^{th}$ write scan signal SWj having the low level. Then, a compensation voltage (e.g., DSi-Vth), obtained by subtracting a threshold voltage Vth of the first transistor T1 from the $i^{th}$ data signal DSi supplied from the $i^{th}$ data line DLi, is applied to the third electrode of the first transistor T1. In other words, the potential of the third electrode of the first transistor T1 may be the compensation voltage (e.g., DSi-Vth). The fourth activation period may overlap with the second activation period. A duration of the second activation period may be greater than a duration of the fourth activation period.

The first drive voltage ELVDD and the compensation voltage (e.g., DSi-Vth) may be applied to the opposite ends of the capacitor Cst, and the capacitor Cst charges corresponding to the difference between the voltages at the opposite ends of the capacitor Cst to store the difference. Here, the second activation period of the $j^{th}$ compensation scan signal SCj may be referred to as the compensation period of the pixel PX.

The $j^{th}$ black scan signal BSj is activated within the second activation period of the $j^{th}$ compensation scan signal SCj. The $j^{th}$ black scan signal BSj has a low level during an activation period (hereinafter, referred to as a third activation period). During the third activation period, the fifth transistor T5 is turned on by receiving the $j^{th}$ black scan signal BSj having the low level through the $j^{th}$ black scan line BSLj. A portion of the drive current Id may escape through the fifth transistor T5 as a bypass current Ibp. The third activation period may overlap with the second activation period. A duration of the second activation period may be greater than a duration of the third activation period. The third activation period may precede the fourth activation period, and may not overlap with the fourth activation period.

When the pixel PX displays a black image, the pixel PX may not normally display the black image if the light emitting element ED emits light, even though a minimum drive current of the first transistor T1 flows as the drive current Id. Accordingly, the fifth transistor T5 according to an embodiment of the present disclosure may distribute a portion of the minimum drive current of the first transistor T1 as the bypass current Ibp to a current path other than the current path toward the light emitting element ED. Here, the minimum drive current of the first transistor T1 refers to a leakage current flowing to the first transistor T1 under the condition that the gate-source voltage Vgs of the first transistor T1 is lower than the threshold voltage Vth, so that the first transistor T1 is turned off. The minimum drive current (e.g., a current of 10 pA or less) flowing to the first transistor T1 under the condition that the first transistor T1 is turned off is transferred to the light emitting element ED, and a black gray-scale image is displayed. When the pixel PX displays a black image, an influence of the bypass current Ibp on the minimum drive current is relatively great, whereas when the pixel PX displays an image, such as a general image or a white image, the bypass current Ibp has little influence on the drive current Id. Accordingly, when the pixel PX displays a black image, the current (e.g., a light emission current Ied) obtained by subtracting the bypass current Ibp escaping through the fifth transistor T5 from the drive current Id may be provided to the light emitting element ED, so that the black image may be clearly expressed. Thus, the pixel PX may implement an accurate black gray-scale image using the fifth transistor T5, thereby improving a contrast ratio.

Afterwards, the $j^{th}$ light emission control signal EMj supplied from the $j^{th}$ light emission control line EMLj is changed from a high level to a low level. The sixth and seventh transistors T6 and T7 are turned on by the light emission control signal EMj having the low level. Then, the drive current Id depending on the voltage difference between the voltage of the third electrode of the first transistor T1 and the first drive voltage ELVDD is generated. The drive current Id is supplied to the light emitting element ED through the seventh transistor T7, and the current Ied flows through the light emitting element ED.

Still referring to FIG. 6, the light receiving sensor FX is connected to a $d^{th}$ sensing line RLd from among the sensing lines RL1 to RLh, where d is a natural number, the $j^{th}$ write scan line SWLj, and a sensing control line CL.

The light receiving sensor FX includes the light receiving element OPD and the sensor drive circuit SDC. The light receiving element OPD may be a photo diode. In an embodiment of the present disclosure, the light receiving element OPD may be an organic photo diode including an organic material as a photoelectric conversion layer. An anode electrode O_AE (hereinafter, referred to as a sensor anode electrode) of the light receiving element OPD may be connected to a first sensing node SN1, and a cathode electrode O_CA (hereinafter, referred to as a sensor cathode electrode) of the light receiving element OPD may be connected with the second drive voltage line VL2 that transfers the second drive voltage ELVSS.

The sensor drive circuit SDC includes three transistors ST1, ST2, and ST3. The three transistors ST1, ST2, and ST3 may include a reset transistor ST1, an amplifying transistor ST2, and an output transistor ST3. At least one of the reset transistor ST1, the amplifying transistor ST2, and the output transistor ST3 may be an oxide semiconductor transistor. In an embodiment of the present disclosure, the reset transistor ST1 may be an oxide semiconductor transistor, and the amplifying transistor ST2 and the output transistor ST3 may be LTPS transistors. However, the reset transistor ST1 and the output transistor ST3 may be oxide semiconductor transistors, and the amplifying transistor ST2 may be an LTPS transistor, but the present disclosure is not limited thereto.

Furthermore, some of the reset transistor ST1, the amplifying transistor ST2, and the output transistor ST3 may be P-type transistors, and the others may be an N-type transistor. In an embodiment of the present disclosure, the amplifying transistor ST2 and the output transistor ST3 may be PMOS transistors, and the reset transistor ST1 may be an NMOS transistor. However, the reset transistor ST1, the amplifying transistor ST2, and the output transistor ST3 may all be N-type transistors or P-type transistors, but the present disclosure is not limited thereto.

Some (e.g., the reset transistor ST1) of the reset transistor ST1, the amplifying transistor ST2, and the output transistor ST3 may be of the same kind as that of the third and fourth transistors T3 and T4 of the pixel PX. The amplifying transistor ST2 and the output transistor ST3 may be transistors of the same kind as that of the first, second, fifth, sixth, and seventh transistors T1, T2, T5, T6, and T7 of the pixel PX.

A circuit configuration of the sensor drive circuit SDC according to embodiments of the present disclosure is not limited to that illustrated in FIG. 6. The sensor drive circuit SDC illustrated in FIG. 6 is merely illustrative, and various suitable changes and modifications may be made to the configuration of the sensor drive circuit SDC as needed or desired.

The reset transistor ST1 includes a first electrode connected with a reset receiving line VL5 that receives a reset voltage RST, a second electrode connected with the first sensing node SN1, and a third electrode connected with the sensing control line CL that receives a sensing control signal CS. In response to the sensing control signal CS, the reset transistor ST1 may reset a potential of the first sensing node SN1 to the reset voltage RST. In an embodiment of the present disclosure, the sensing control line CL may be a line electrically insulated from the scan lines SWLj, SCLj, SILj, and BSLj. However, the present disclosure is not limited thereto. As another example, the sensing control signal CS may be the $j^{th}$ compensation scan signal SCj supplied from the $j^{th}$ compensation scan line SCLj. In this case, the sensing control line CL may be electrically connected with the $j^{th}$ compensation scan line SCLj. In other words, the reset transistor ST1 may receive the $j^{th}$ compensation scan signal SCj, which is supplied from the $j^{th}$ compensation scan line SCLj, as the sensing control signal CS. However, the present disclosure is not limited thereto, and the sensing control signal CS may be a signal different from (e.g., separate from) the $j^{th}$ compensation scan signal SCj. The timing at which the sensing control signal CS is activated and the timing at which the $j^{th}$ compensation scan signal SCj is activated may be different from each other.

In an embodiment of the present disclosure, the reset voltage RST may be a DC voltage that is maintained or substantially maintained at a lower voltage level than that of the second drive voltage ELVSS. However, the present disclosure is not limited thereto. The reset voltage RST may have a lower voltage level than that of the second drive voltage ELVSS at least during an activation period of the sensing control signal CS. In an embodiment of the present disclosure, the voltage generation block VGB (e.g., refer to FIG. 5) may generate the reset voltage RST as the same or substantially the same voltage as that of one of the first and second initialization voltages VINT1 and VINT2.

The reset transistor ST1 may include a plurality of sub-reset transistors that are connected in series. For example, the reset transistor ST1 may include two sub-reset transistors (hereinafter, referred to as first and second sub-reset transistors). In this case, a third electrode of the first sub-reset transistor and a third electrode of the second sub-reset transistor are connected to the sensing control line CL. Furthermore, a second electrode of the first sub-reset transistor and a first electrode of the second sub-reset transistor may be electrically connected with each other. In addition, the reset voltage RST may be applied to a first electrode of the first sub-reset transistor, and a second electrode of the second sub-reset transistor may be electrically connected with the first sensing node SN1. However, the number of sub-reset transistors is not limited thereto, and may be variously modified as needed or desired.

The amplifying transistor ST2 includes a first electrode connected with a sensing drive line SVL that receives a sensing drive voltage SVD, a second electrode connected with a second sensing node SN2, and a third electrode connected with the first sensing node SN1. The amplifying transistor ST2 may be turned on depending on the potential of the first sensing node SN1, and may apply the sensing drive voltage SVD to the second sensing node SN2. In an embodiment of the present disclosure, the sensing drive voltage SVD may be one of the first drive voltage ELVDD, the first initialization voltage VINT1, or the second initialization voltage VINT2. When the sensing drive voltage SVD is the first drive voltage ELVDD, the sensing drive line SVL may be electrically connected to the first drive voltage line VL1. When the sensing drive voltage SVD is the first initialization voltage VINT1, the sensing drive line SVL may be electrically connected to the first initialization voltage line VL3. When the sensing drive voltage SVD is the second initialization voltage VINT2, the sensing drive line SVL may be electrically connected to the second initialization voltage line VL4.

The output transistor ST3 includes a first electrode connected with the second sensing node SN2, a second electrode connected with the $d^{th}$ sensing line RLd, and a third electrode connected with an output control line that receives an output control signal. In response to the output control signal, the output transistor ST3 may transfer a $d^{th}$ sensing signal FSd to the $d^{th}$ sensing line RLd. The output control signal may be the $j^{th}$ write scan signal SWj supplied through the $j^{th}$ write scan line SWLj. In other words, the output transistor ST3 may receive the $j^{th}$ write scan signal SWj, which is supplied from the $j^{th}$ write scan line SWLj, as the output control signal.

The light receiving element OPD of the light receiving sensor FX may be exposed to light emitted from the light emitting element ED. In an embodiment of the present disclosure, the light receiving element OPD may generate photo-charges corresponding to the received light, and the generated photo-charges may be accumulated in the first sensing node SN1. In more detail, in the case where the light emitting element ED emits light when the user US touches the display surface IS of the display device DD (e.g., refer to FIG. 1) with a hand, the light receiving element OPD receives light emitted from the light emitting element ED and reflected by the hand of the user US, and generates photo-charges corresponding to the reflected light.

The $d^{th}$ sensing signal FSd, which flows from the sensing drive line SVL to the $d^{th}$ sensing line RLd through the amplifying transistor ST2 and the output transistor ST3 when the output transistor ST3 is turned on, is determined by the amount of charge in the first sensing node SN1. In an embodiment of the present disclosure, when the output transistor ST3 is a P-type transistor, the magnitude of the $d^{th}$ sensing signal FSd may be decreased as the amount of photo-charge generated by the light receiving element OPD and accumulated in the first sensing node SN1 is increased.

Figure 7A:
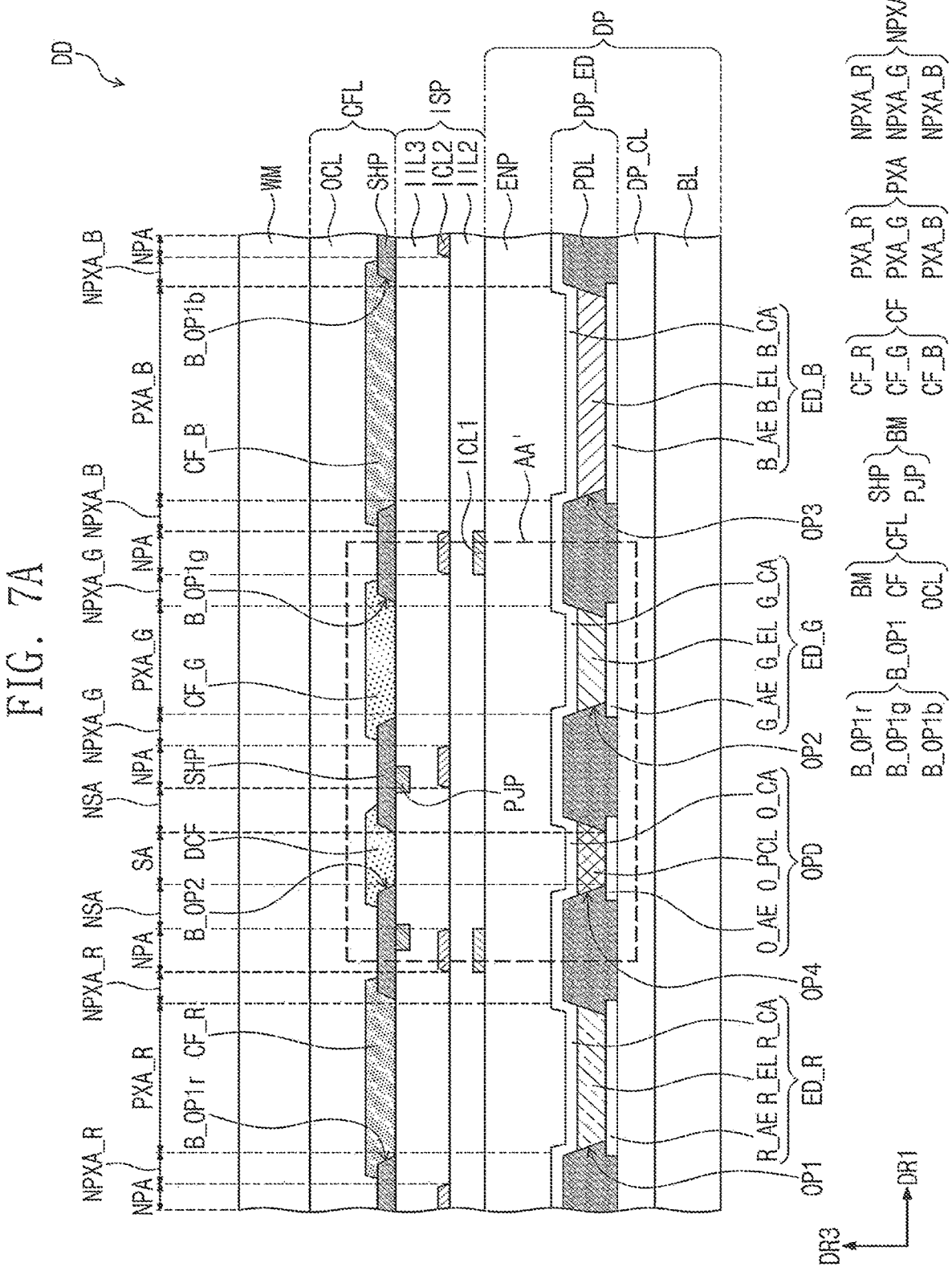
Figure 7B:
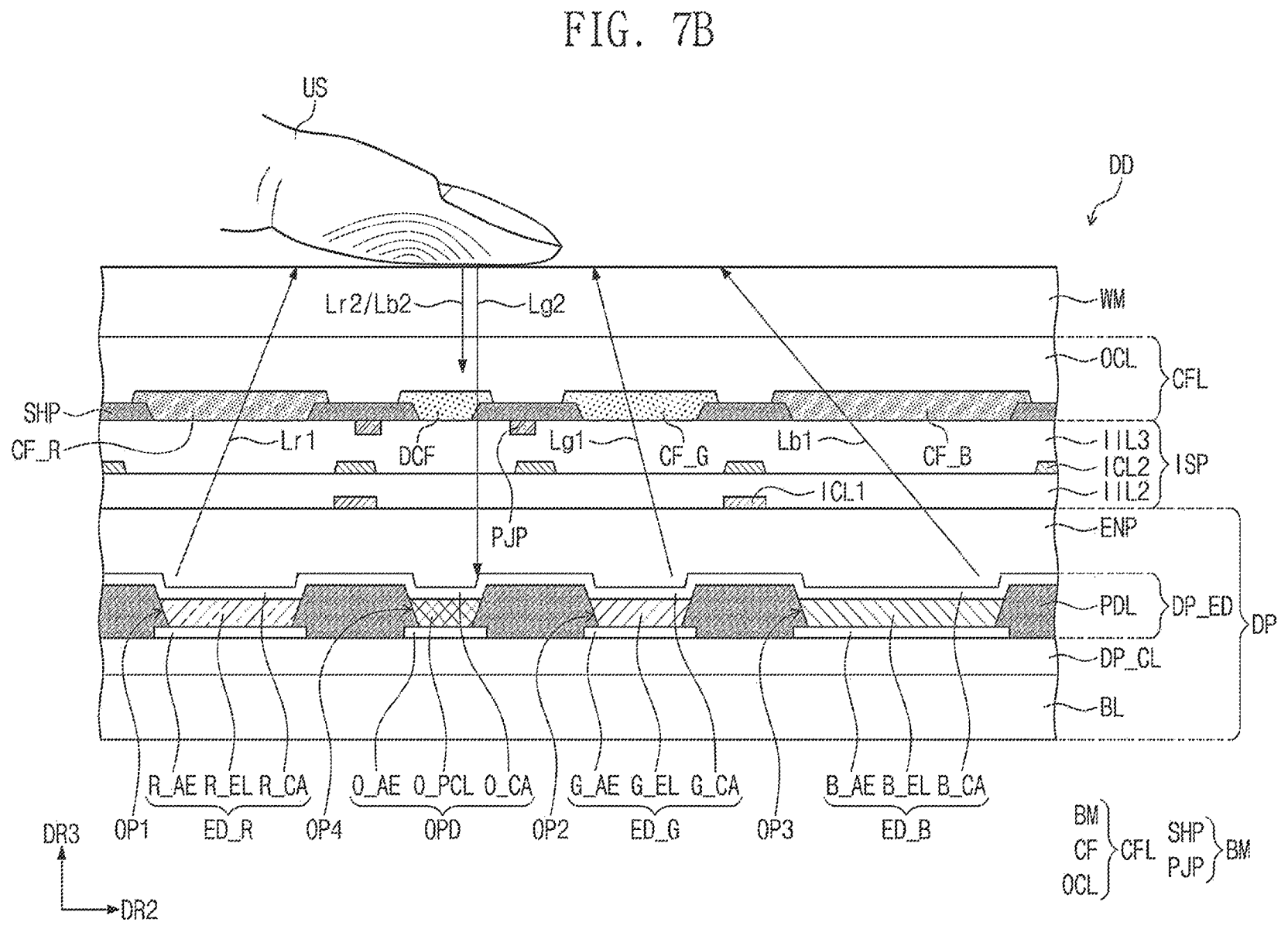

FIGS. 7A and 7B are cross-sectional views of the display device illustrating an operation of calculating fingerprint information of a user according to an embodiment of the present disclosure.

Referring to FIG. 7A, each of the pixels PX (e.g., refer to FIG. 5) included in the display panel DP may be one of a red pixel including a red light emitting element ED_R, a green pixel including a green light emitting element ED_G, or a blue pixel including a blue light emitting element ED_B. The red light emitting element ED_R includes a red anode electrode R_AE, a red light emitting layer R_EL, and a red cathode electrode R_CA. The green light emitting element ED_G includes a green anode electrode G_AE, a green light emitting layer G_EL, and a green cathode electrode G_CA. The blue light emitting element ED_B includes a blue anode electrode BAE, a blue light emitting layer B_EL, and a blue cathode electrode B_CA. In an embodiment of the present disclosure, the light receiving sensor FX (e.g., refer to FIG. 5) included in the display panel DP includes the light emitting element OPD. The light receiving element OPD includes a sensor anode electrode O_AE, a photoelectric conversion layer O_PCL, and a sensor cathode electrode O_CA. In an embodiment of the present disclosure, the light receiving element OPD may be a photo diode.

The element layer DP_ED is disposed on the circuit layer DP_CL. The element layer DP_ED includes the red light emitting element ED_R, the green light emitting element ED_G, the blue light emitting element ED_B, the light receiving element OPD, and an element defining film PDL.

The element layer DP_ED includes a first electrode layer that includes the red, green, and blue anode electrodes R_AE, G_AE, and B_AE, and the sensor anode electrode O_AE. The first electrode layer may be disposed on the circuit layer DP_CL, and the red, green, and blue anode electrodes R_AE, G_AE, and B_AE and the sensor anode electrode O_AE may be concurrently (e.g., simultaneously) formed through the same or substantially the same process.

The element defining film PDL is formed on the first electrode layer. First to fourth openings OP1, OP2, OP3, and OP4 of the element defining film PDL expose at least portions of the red, green, and blue anode electrodes R_AE, G_AE, and B_AE and the sensor anode electrode O_AE, respectively. The element defining film PDL is disposed between the red, green, and blue light emitting elements ED_R, ED_G, ED_B and the light receiving element OPD. In an embodiment of the present disclosure, the element defining film PDL may be disposed between the red light emitting element ED_R, the green light emitting element ED_G, the blue light emitting element ED_B, and the light receiving element OPD. In an embodiment of the present disclosure, the element defining film PDL may further include a black material. The element defining film PDL may further include a black organic dye/pigment, such as carbon black, aniline black, or the like. The element defining film PDL may be formed by mixing a blue organic material and a black organic material with each other. The element defining film PDL may additionally include a liquid-repellent organic material.

In an embodiment of the present disclosure, an area where the red light emitting element ED_R, the blue light emitting element ED_B, and the green light emitting element ED_G are disposed may be defined as a pixel area. The pixel area may include an emissive area PXA, and a non-emissive area NPXA adjacent to the emissive area PXA. The non-emissive area NPXA may surround (e.g., around a periphery of) the emissive area PXA. The emissive area PXA includes a first emissive area PXA_R, a second emissive area PXA_G, and a third emissive area PXA_B. The non-emissive area NPXA includes a first non-emissive area NPXA_R, a second non-emissive area NPXA_G, and a third non-emissive area NPXA_B, which are adjacent to the first to third emissive areas PXA_R, PXA_G, and PXA_B, respectively. The non-emissive areas NPXA_R, NPXA_G, and NPXA_B may surround (e.g., around peripheries of) the emissive areas PXA_R, PXA_G, and PXA_B, respectively. In the present embodiment, the first emissive area PXA_R is defined to correspond to a partial area of the red anode electrode R_AE exposed by the first opening OP1. The second emissive area PXA_G is defined to correspond to a partial area of the green anode electrode G_AE exposed by the second opening OP2. The third emissive area PXA_B is defined to correspond to a partial area of the blue anode electrode B_AE exposed by the third opening OP3. A non-pixel area NPA may be defined between the first to third non-emissive areas NPXA_R, NPXA_G, and NPXA_B.

In an embodiment of the present disclosure, an area where the light receiving element OPD is disposed may be defined as a sensing area SA. The sensing area SA is defined to correspond to a partial area of the sensor anode electrode O_AE exposed by the fourth opening OP4. An area adjacent to the sensing area SA may be defined as a non-sensing area NSA. The non-sensing area NSA may surround (e.g., around a periphery of) the corresponding sensing area SA. In an embodiment of the present disclosure, the non-pixel area NPA may be defined between the non-sensing area NSA and the non-emissive area NPXA.

The element layer DP_ED includes an emissive layer including the red, green, and blue light emitting layers R_EL, G_EL, and B_EL. The emissive layer may be disposed on the first electrode layer. The red, green, and blue light emitting layers R_EL, G_EL, and B_EL may be disposed in areas corresponding to the first to third openings OP1, OP2, and OP3, respectively. The red, green, and blue light emitting layers R_EL, G_EL, and B_EL may be separately formed from each other at (e.g., in or on) the red, green, and blue pixels, respectively. Each of the red, green, and blue light emitting layers R_EL, G_EL, and B_EL may contain an organic material and/or an inorganic material. The red, green, and blue light emitting layers R_EL, G_EL, and B_EL may generate light beams having desired colors (e.g., predetermined colors). For example, the red light emitting layer R_EL may generate red light, the green light emitting layer G_EL may generate green light, and the blue light emitting layer B_EL may generate blue light.

Although the patterned red, green, and blue light emitting layers R_EL, G_EL, and B_EL are illustrated and described in the present embodiment, one emissive layer may be commonly disposed at (e.g., in or on) the first to third emissive areas PXA_R, PXA_G, and PXA_B. In this case, the emissive layer may generate white light or blue light. Furthermore, the emissive layer may have a multi-layered structure, which may be referred to as a tandem structure.

Each of the red, green, and blue light emitting layers R_EL, G_EL, and B_EL may contain a low molecular weight organic material or a high molecular weight organic material, as a luminescent material. As another example, each of the red, green, and blue light emitting layers R_EL, G_EL, and B_EL may contain a quantum-dot material as a luminescent material. A core of a quantum dot may be selected from Group II-VI compounds, Group III-V compounds, Group IV-VI compounds, Group IV elements, Group IV compounds, and/or any suitable combinations thereof.

The element layer DP_ED further includes the photoelectric conversion layer O_PCL. The photoelectric conversion layer O_PCL may be disposed on the first electrode layer. The photoelectric conversion layer O_PCL may be disposed in the fourth opening OP4.

The element layer DP_ED includes a second electrode layer, which includes the red, green, and blue cathode electrodes R_CA, G_CA, and B_CA, and the sensor cathode electrode O_CA. The second electrode layer is disposed on the red, green, and blue light emitting layers R_EL, G_EL, and B_EL, and the photoelectric conversion layer O_PCL. The red, green, and blue cathode electrodes R_CA, G_CA, and B_CA may be electrically connected with one another. In an embodiment of the present disclosure, the red, green, and blue cathode electrodes R_CA, G_CA, and B_CA may have an integral shape. In this case, the red, green, and blue cathode electrodes R_CA, G_CA, and B_CA may be commonly disposed at (e.g., in or on) the first to third emissive areas PXA_R, PXA_G, and PXA_B, the first to third non-emissive areas NPXA_R, NPXA_G, and NPXA_B, and the non-pixel area NPA. In an embodiment of the present disclosure, the sensor cathode electrode O_CA may be electrically connected with the red, green, and blue cathode electrodes R_CA, G_CA, and B_CA. In an embodiment of the present disclosure, the red, green, and blue cathode electrodes R_CA, G_CA, and B_CA and the sensor cathode electrode O_CA may have an integral shape. The sensor cathode electrode O_CA may be concurrently (e.g., simultaneously) formed with the red, green, and blue cathode electrodes R_CA, G_CA, and B_CA through the same or substantially the same process as that of the red, green, and blue cathode electrodes R_CA, G_CA, and B_CA.

The sensor anode electrode O_AE and the sensor cathode electrode O_CA may each receive an electrical signal. The sensor anode electrode O_AE may receive a different signal from that of the sensor cathode electrode O_CA. Accordingly, a suitable electric field (e.g., a predetermined electric field) may be formed between the sensor anode electrode O_AE and the sensor cathode electrode O_CA. The photoelectric conversion layer O_PCL generates an electrical signal corresponding to light incident on the light receiving element OPD. The photoelectric conversion layer O_PCL may generate charges by absorbing the energy of the incident light. For example, the photoelectric conversion layer O_PCL may contain a photosensitive semiconductor material.

The charges generated in the photoelectric conversion layer O_PCL change the electric field between the sensor anode electrode O_AE and the sensor cathode electrode O_CA. The amount of charge generated in the photoelectric conversion layer O_PCL may vary depending on whether light is incident on the light receiving element OPD, and the amount and intensity of the light incident on the light receiving element OPD. Accordingly, the electric field formed between the sensor anode electrode O_AE and the sensor cathode electrode O_CA may be varied. The light emitting element OPD according to one or more embodiments of the present disclosure may obtain fingerprint information of the user US (e.g., refer to FIG. 1) through a change in the electric field between the sensor anode electrode O_AE and the sensor cathode electrode O_CA. However, the present disclosure is not limited thereto, and the light receiving element OPD may include a phototransistor with the photoelectric conversion layer O_PCL as an active layer. In this case, the light receiving element OPD may obtain fingerprint information by sensing the amount of electric current flowing through the phototransistor. The light receiving element OPD according to an embodiment of the present disclosure may include various suitable photoelectric conversion elements capable of generating an electrical signal in response to a change in the amount of light, and is not limited to any particular embodiment.

The encapsulation layer ENP is disposed on the element layer DP_ED. The encapsulation layer ENP includes at least an inorganic layer or an organic layer. In an embodiment of the present disclosure, the encapsulation layer ENP may include two inorganic layers, and an organic layer disposed therebetween. In an embodiment of the present disclosure, the encapsulation layer ENP may include a plurality of inorganic layers and a plurality of organic layers that are alternately stacked one above another.

An inorganic encapsulation layer protects the red, green, and blue light emitting elements ED_R, ED_G, and ED_B and the light receiving element OPD from moisture/oxygen, and an organic encapsulation layer protects the red, green, and blue light emitting elements ED_R, ED_G, and ED_B and the light receiving element OPD from foreign matter, such as dust particles. The inorganic encapsulation layer may include a silicon nitride (SiNw) layer, a silicon oxynitride (SiON) layer, a silicon oxide (SiOx) layer, a titanium oxide (TiOy) layer, or an aluminum oxide (AlOz) layer, but is not particularly limited thereto. The organic encapsulation layer may include, but is not particularly limited to, an acrylate-based organic layer.

The display device DD includes the input sensing layer ISP disposed on the display panel DP, and the color filter layer CFL and the window WM disposed on the input sensing layer ISP.

The input sensing layer ISP may be directly disposed on the encapsulation layer ENP. The input sensing layer ISP includes the first conductive layer ICL1, the second sensing insulation layer IIL2, the second conductive layer ICL2, and the third sensing insulation layer IIL3. The first conductive layer ICL1 may be disposed on the encapsulation layer ENP. Although FIG. 7A illustrates a structure in which the first conductive layer ICL1 is directly disposed on the encapsulation layer ENP, the present disclosure is not limited thereto. The input sensing layer ISP may further include the first sensing insulation layer IIL1 disposed between the first conductive layer ICL1 and the encapsulation layer ENP. In this case, the encapsulation layer ENP may be covered by the first sensing insulation layer IIL1, and the first conductive layer ICL1 may be disposed on the first sensing insulation layer IIL1. In an embodiment of the present disclosure, the first sensing insulation layer IIL1 may contain an inorganic insulating material.

The second sensing insulation layer IIL2 may cover the first conductive layer ICL1. The second conductive layer ICL2 is disposed on the second sensing insulation layer IIL2. Although FIG. 7A illustrates a structure in which the input sensing layer ISP includes the first and second conductive layers ICL1 and ICL2, the present disclosure is not limited thereto. For example, the input sensing layer ISP may include only one of the first and second conductive layers ICL1 and ICL2.

The third sensing insulation layer IIL3 may be disposed on the second conductive layer ICL2. The third sensing insulation layer IIL3 may contain an organic insulating material. The third sensing insulation layer IIL3 may serve to protect the first and second conductive layers ICL1 and ICL2 from moisture/oxygen, and to protect the first and second conductive layers ICL1 and ICL2 from foreign matter.

The color filter layer CFL may be disposed on the input sensing layer ISP. The color filter layer CFL may be directly disposed on the third sensing insulation layer IIL3. The color filter layer CFL may include a first color filter CF_R, a second color filter CF_G, and a third color filter CF_B. The first color filter CF_R has a first color, the second color filter CF_G has a second color, and the third color filter CF_B has a third color. In an embodiment of the present disclosure, the first color may be red, the second color may be green, and the third color may be blue. The first color filter CF_R, the second color filter CF_G, and the third color filter CF_B overlap with the red, green, and blue light emitting elements ED_R, ED_G, and ED_B, respectively.

The color filter layer CFL may further include a dummy color filter DCF. In an embodiment of the present disclosure, the dummy color filter DCF may be disposed to correspond to the sensing area SA, and may overlap with the light receiving element OPD. The dummy color filter DCF may overlap with the sensing area SA and the non-sensing area NSA. In an embodiment of the present disclosure, the dummy color filter DCF may have the same or substantially the same color as that of one of the first to third color filters CF_R, CF_G, and CF_B. In an embodiment of the present disclosure, the dummy color filter DCF may have the same or substantially the same green color as that of the second color filter CF_G. However, the present disclosure is not limited thereto. The color filter layer CFL may include only the first to third color filters CF_R, CF_G, and CF_B, and may not include the dummy color filter DCF.

The color filter layer CFL may further include the light blocking layer BM. The light blocking layer BM may be disposed to correspond to the non-pixel area NPA. The light blocking layer BM may be disposed to overlap with the first and second conductive layers ICL1 and ICL2 at (e.g., in or on) the non-pixel area NPA. In an embodiment of the present disclosure, the light blocking layer BM may overlap with the non-pixel area NPA, the first to third non-emissive areas NPXA_R, NPXA_G, and NPXA_B, and the non-sensing area NSA. The light blocking layer BM may not overlap with the first to third emissive areas PXA_R, PXA_G, and PXA_B and the sensing area SA.

In an embodiment of the present disclosure, the light blocking layer BM includes a light blocking portion SHP, and a protrusion PJP protruding from the light blocking portion SHP toward the element defining film PDL. In an embodiment of the present disclosure, the light blocking portion SHP is disposed on the third sensing insulation layer IIL3. A first light blocking opening B_OP1 overlapping with the red, green, and blue light emitting elements ED_R, ED_G, ED_B, and a second light blocking opening B_OP2 overlapping with the light receiving element OPD, are defined in (e.g., penetrate) the light blocking portion SHP. In an embodiment of the present disclosure, the first light blocking opening B_OP1 includes a first sub-opening B_OP1r overlapping with the red light emitting element ED_R, a second sub-opening B_OP1g overlapping with the green light emitting element ED_G, and a third sub-opening B_OP1b overlapping with the blue light emitting element ED_B. The first to third sub-openings B_OP1r, B_OP1g, and B_OP1b and the second light blocking opening B_OP2 are defined in (e.g., penetrate) the light blocking portion SHP. The light blocking portion SHP overlaps with the element defining film PDL on a plane (e.g., in a plan view). The protrusion PJP may be disposed to correspond to the non-pixel area NPA. The protrusion PJP may be disposed to overlap with the non-pixel area NPA and the non-sensing area NSA. The protrusion PJP may surround (e.g., around a periphery of) the sensing area SA on the plane (e.g., in a plan view). The shape and arrangement of the protrusion PJP will be described in more detail below with reference to FIGS. 8A to 9C.

The color filter layer CFL may further include an over-coating layer OCL. The over-coating layer OCL may contain an organic insulating material. The over-coating layer OCL may have a sufficient thickness (e.g., in the third direction DR3) so as to remove or reduce steps between the first to third color filters CF_R, CF_G, and CF_B. The over-coating layer OCL may have a sufficient thickness to remove or reduce steps between the first to third color filters CF_R, CF_G, and CF_B and the dummy color filter DCF. The over-coating layer OCL may contain any suitable material that has a suitable thickness (e.g., a predetermined thickness), and is capable of flattening or substantially flattening the upper surface of the color filter layer CFL, but the present disclosure is not limited thereto. For example, the over-coating layer OCL may contain an acrylate-based organic material.

The window WM may be disposed on the color filter layer CFL.

Referring to FIG. 7B, when the display device DD operates, each of the red, green, and blue light emitting elements ED_R, ED_G, and ED_B outputs light. The red light emitting element ED_R outputs red light in a red wavelength band, the green light emitting element ED_G outputs green light in a green wavelength band, and the blue light emitting element ED_B outputs blue light in a blue wavelength band. Hereinafter, the same or substantially the same components as those described above with reference to FIG. 7A are assigned with the same reference symbols, and thus, redundant description thereof may not be repeated.

In an embodiment of the present disclosure, the light receiving element OPD may receive light from certain (e.g., specific) light emitting elements (e.g., the green light emitting element ED_G) from among the red, green, and blue light emitting elements ED_R, ED_G, and ED_B. In other words, first light Lg1 may be output from the green light emitting element ED_G, and the light receiving element OPD may receive first sub-light Lg2 obtained by reflection of the first light Lg1 by the user's US fingerprint. The first light Lg1 and the first sub-light Lg2 may be green light in the green wavelength band. The dummy color filter DCF is disposed over the light receiving element OPD. The dummy color filter DCF may be green in color. Accordingly, the first sub-light Lg2 may pass through the dummy color filter DCF, and may be incident on the light receiving element OPD.

On the other hand, second light Lr1 and third light Lb1 output from the red and blue light emitting elements ED_R and ED_B may also be reflected by the hand of the user US. For example, when light obtained by reflection of the second light Lr1 output from the red light emitting element ED_R by the hand of the user US is defined as second sub-light Lr2, the second light Lr1 and the second sub-light Lr2 may be red light in the red wavelength band. The second sub-light Lr2 may be absorbed by the dummy color filter DCF. Accordingly, the second sub-light Lr2 may not pass through the dummy color filter DCF, and may not be incident on the light receiving element OPD. Similarly, when light obtained by reflection of the third light Lb1 output from the blue light emitting element ED_B by the hand of the user US is defined as third sub-light Lb2, the third light Lb1 and the third sub-light Lb2 may be blue light in the blue wavelength band. The third sub-light Lb2 may be absorbed by the dummy color filter DCF. Accordingly, the third sub-light Lb2 may not pass through the dummy color filter DCF, and may not be incident on the light receiving element OPD. Thus, only the first sub-light Lg2 may be provided to the light receiving element OPD. The light receiving element OPD may generate photo-charges corresponding to the first sub-light Lg2 incident thereon, and may measure fingerprint information of the user US based on the generated photo-charges.

FIGS. 8A to 8D are enlarged sectional views of the area AA' show in FIG. 7A, illustrating protrusions according to embodiments of the present disclosure. Hereinafter, the same or substantially the same components as those described above with reference to FIGS. 7A and 7B are assigned the same reference symbols, and thus, redundant description thereof may not be repeated. Furthermore, for convenience of illustration, the first and second conductive layers ICL1 and ICL2 (e.g., refer to FIG. 7A) included in the input sensing layer ISP are not shown.

Figure 8A:
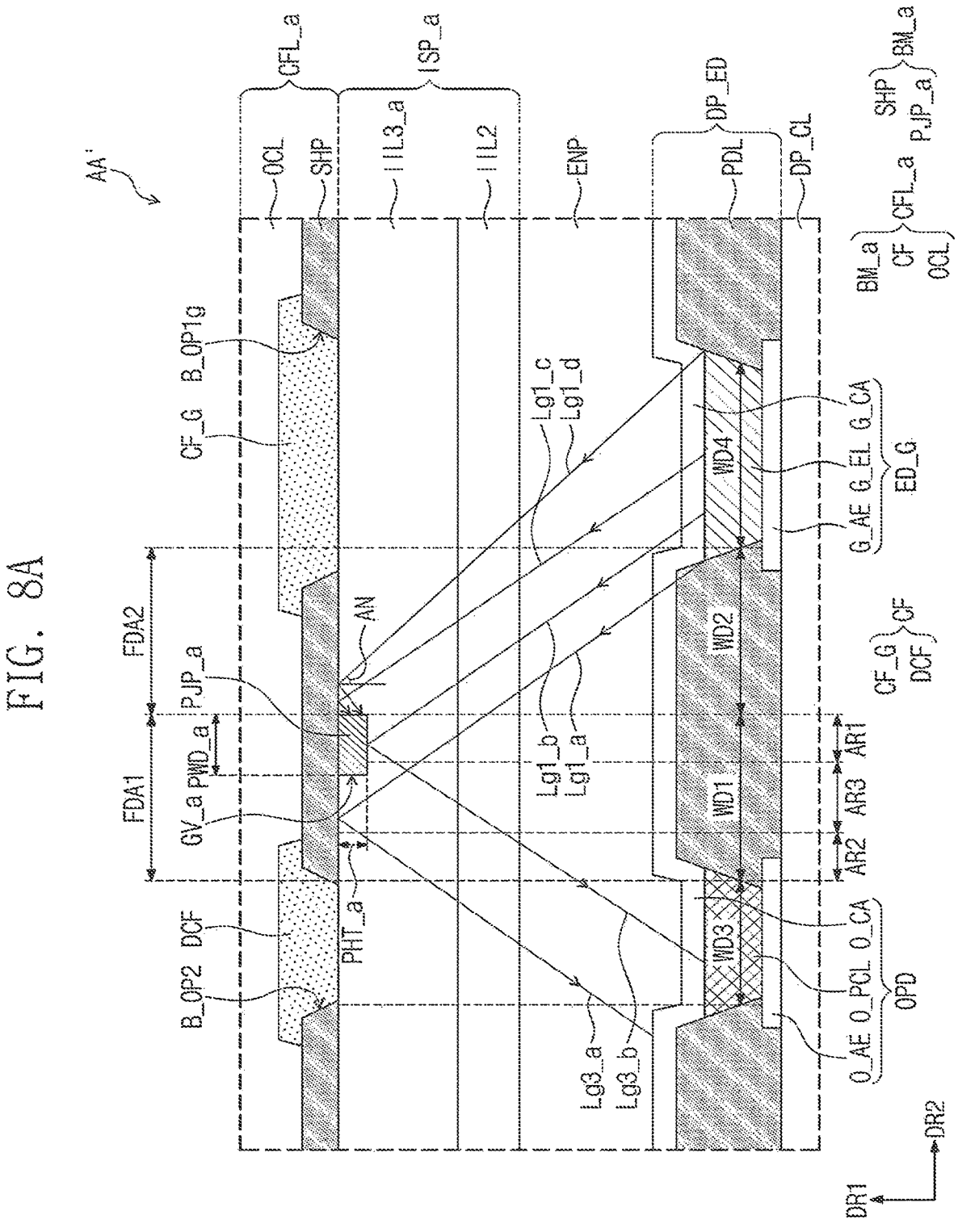

Referring to FIG. 8A, the element defining film PDL disposed between the light receiving element OPD and the green light emitting element ED_G includes a first defining area FDA1 adjacent to the light receiving element OPD, and a second defining area FDA2 disposed between the first defining area FDA1 and the green light emitting element ED_G. In an embodiment of the present disclosure, a protrusion PJP_a is disposed at (e.g., in or on) the first defining area FDA1. In an embodiment of the present disclosure, the second sub-opening B_OP1g and the second light blocking opening B_OP2 are arranged along a direction opposite to the second direction DR2. In an embodiment of the present disclosure, when the direction opposite to the second direction DR2 is referred to as a first reference direction, a first width WD1 of the first defining area FDA1 in the first reference direction may be equal to or substantially equal to a second width WD2 of the second defining area FDA2 in the first reference direction.

In an embodiment of the present disclosure, a light blocking layer BM_a includes the light blocking portion SHP and the protrusion PJP_a. A color filter layer CFL_a includes the light blocking layer BM_a, the color filter CF, and the over-coating layer OCL.

The protrusion PJP_a has a shape protruding from the light blocking portion SHP toward the element defining film PDL. In more detail, when the encapsulation layer ENP, the input sensing layer ISP_a, and the color filter layer CFL_a are sequentially disposed on the element defining film PDL in the first direction DR1, the protrusion PJP_a may protrude from the light blocking portion SHP in a direction opposite to the first direction DR1.

In an embodiment of the present disclosure, a third sensing insulation layer IIL3_a includes a groove GV_a formed to correspond to the protrusion PJP_a. The protrusion PJP_a is accommodated in the groove GV_a. In an embodiment of the present disclosure, the first defining area FDA1 includes a first area AR1 adjacent to the second defining area FDA2, a second area AR2 adjacent to the light receiving element OPD, and a third area AR3 disposed between the first area AR1 and the second area AR2. In an embodiment of the present disclosure, the first area AR1 may be an area that contacts the second defining area FDA2, and the second area AR2 may be an area that contacts the light receiving element OPD.

The protrusion PJP_a is disposed to overlap with the first area AR1 and the third area AR3. In an embodiment of the present disclosure, the protrusion PJP_a does not overlap with the second area AR2.

In an embodiment of the present disclosure, the light blocking portion SHP and the protrusion PJP_a may be a black matrix. The light blocking portion SHP and the protrusion PJP_a may be formed of an organic light blocking material or an inorganic light blocking material that contains a black pigment or a black dye. The light blocking portion SHP and the protrusion PJP_a may contain the same or substantially the same material as each other. The light blocking portion SHP and the protrusion PJP_a may be concurrently (e.g., simultaneously) formed through the same or substantially the same process. However, the present disclosure is not limited thereto. The light blocking portion SHP and the protrusion PJP_a may be formed through a continuous process.

In an embodiment of the present disclosure, the light blocking portion SHP may prevent or substantially prevent light leakage, and may distinguish borders between the first to third color filters CF_R, CF_G, and CF_B (e.g., refer to FIG. 7A). The light blocking portion SHP may distinguish the borders between the first to third color filters CF_R, CF_G, and CF_B and the dummy color filter DCF. In FIG. 8A, the light blocking portion SHP distinguishes the border between the second color filter CF_G and the dummy color filter DCF. However, a portion of light provided from the green light emitting element ED_G to the light blocking portion SHP may be reflected from the light blocking portion SHP, and may be provided to the light receiving element OPD. In this case, the light receiving element OPD receives light that is not reflected by a hand of the user US (e.g., refer to FIG. 1), and therefore, reliability of a measurement of the fingerprint information of the user US may be lowered.

The protrusion PJP_a may be a component for preventing or substantially preventing light output from the red, green, and blue light emitting elements ED_R, ED_G, ED_B (e.g., refer to FIG. 7A) from being reflected by the light blocking portion SHP to the light receiving element OPD. The protrusion PJP_a may be disposed to overlap with a light path along which light output from the red, green, and blue light emitting elements ED_R, ED_G, ED_B and reflected by the light blocking portion SHP is provided to the light receiving element OPD. In FIG. 8A, the protrusion PJP_a is a component for preventing or substantially preventing light output from the green light emitting element ED_G from being reflected by the light blocking portion SHP to the light receiving element OPD. The following description will be given based on the protrusion PJP_a illustrated in FIG. 8A.

In an embodiment of the present disclosure, the length of the light receiving element OPD in the first reference direction may be referred to as a third width WD3, and the length of the green light emitting element ED_G in the first reference direction may be referred to as a fourth width WD4. A point where the first defining area FDA1 and the second defining area FDA2 contact each other may be referred to as a reference point. When the light blocking layer BM_a does not include the protrusion PJP_a, from among light output from the green light emitting element ED_G, light provided from the reference point of the light blocking portion SHP to a point spaced apart by half of the third width WD3 in the first reference direction may be reflected by the light blocking portion SHP to the light receiving element OPD. Furthermore, from among light output from the green light emitting element ED_G, light provided from the reference point of the light blocking portion SHP to a point spaced apart by half of the fourth width WD4 in the direction opposite to the first reference direction may be reflected by the light blocking portion SHP to the light receiving element OPD.

However, when the light blocking layer BM_a includes the protrusion PJP_a, the amount of light output from the green light emitting element ED_G and reflected by the light blocking portion SHP to the light receiving element OPD is decreased, as compared with when the light blocking layer BM_a does not include the protrusion PJP_a. In an embodiment of the present disclosure, when the light blocking layer BM_a includes the protrusion PJP_a, a distance between the green light emitting element ED_G and the protrusion PJP_a in the first direction DR1 is shorter than a distance between the green light emitting element ED_G and the light blocking portion SHP in the first direction DR1. Accordingly, light output from the green light emitting element ED_G may not move a distance to be provided to the light receiving element OPD after being reflected by the light blocking portion SHP. Thus, the amount of light output from the green light emitting element ED_G and reflected by the light blocking portion SHP to the light receiving element OPD is decreased. Furthermore, the light path of light output from the green light emitting element ED_G and reflected in the direction opposite to the first reference direction from the reference point of the light blocking portion SHP is blocked by the protrusion PJP_a, and thus, the light is not provided to the light receiving element OPD. Accordingly, the amount of light output from the green light emitting element ED_G and reflected by the light blocking portion SHP to the light receiving element OPD is decreased.

In an embodiment of the present disclosure, a width PWD_a of the protrusion PJP_a in the first reference direction (hereinafter, referred to as a protrusion width) may be smaller than or equal to half of the third width WD3. From among light output from the green light emitting element ED_G, light provided from the reference point of the light blocking portion SHP to a point located at a distance greater than half of the third width WD3 in the first reference direction from the reference point is referred to as first incident light Lg1_a, and the first incident light Lg1_a reflected by the light blocking portion SHP is referred to as first reflected light Lg3_a. The first reflected light Lg3_a is not provided to the light receiving element OPD according to Snell's Law, even though the protrusion PJP_a does not exist. Accordingly, the protrusion width PWD_a of the protrusion PJP_a may be smaller than or equal to half of the third width WD3.

The protrusion PJP_a protrudes toward the element defining film PDL in the direction opposite to the first direction DR1. When the direction opposite to the first direction DR1 is referred to as a second reference direction, a height PHT_a of the protrusion PJP_a (hereinafter, referred to as a protrusion height) in the second reference direction is proportional to half of the fourth width WD4. However, the present disclosure is not limited thereto. The height of the protrusion PJP_a may be proportional to half of the difference between the fourth width WD4 and the third width WD3. In an embodiment of the present disclosure, when light output from a portion of the green light emitting element ED_G that is spaced apart from the second defining area FDA2 is referred to as third incident light Lg1_c and fourth incident light Lg1_d, an angle at which the fourth incident light Lg1_d is incident on the light blocking portion SHP is referred to as the maximum incidence angle AN. In this case, the height of the protrusion PJP_a may be inversely proportional to the size of the maximum incidence angle AN.

In an embodiment of the present disclosure, light provided from the green light emitting element ED_G toward the protrusion PJP_a is referred to as second incident light Lg1_b, and the second incident light Lg1_b reflected by the protrusion PJP_a is referred to as second reflected light Lg3_b. The second reflected light Lg3_b may be provided to the light receiving element OPD. However, even in this case, the third incident light Lg1_c and the fourth incident light Lg1_d provided from the green light emitting element ED_G are blocked by the protrusion PJP_a, and are not provided to the light receiving element OPD, and thus, reliability of the measurement of the fingerprint information of the user US by the light receiving element OPD may be improved. Furthermore, when light output from the green light emitting element ED_G is reflected by the protrusion PJP_a according to one or more embodiments of the present disclosure, the path of the light to the light receiving element OPD may be reduced, and thus, the amount of light provided to the light receiving element OPD may be reduced.

Figure 8B:
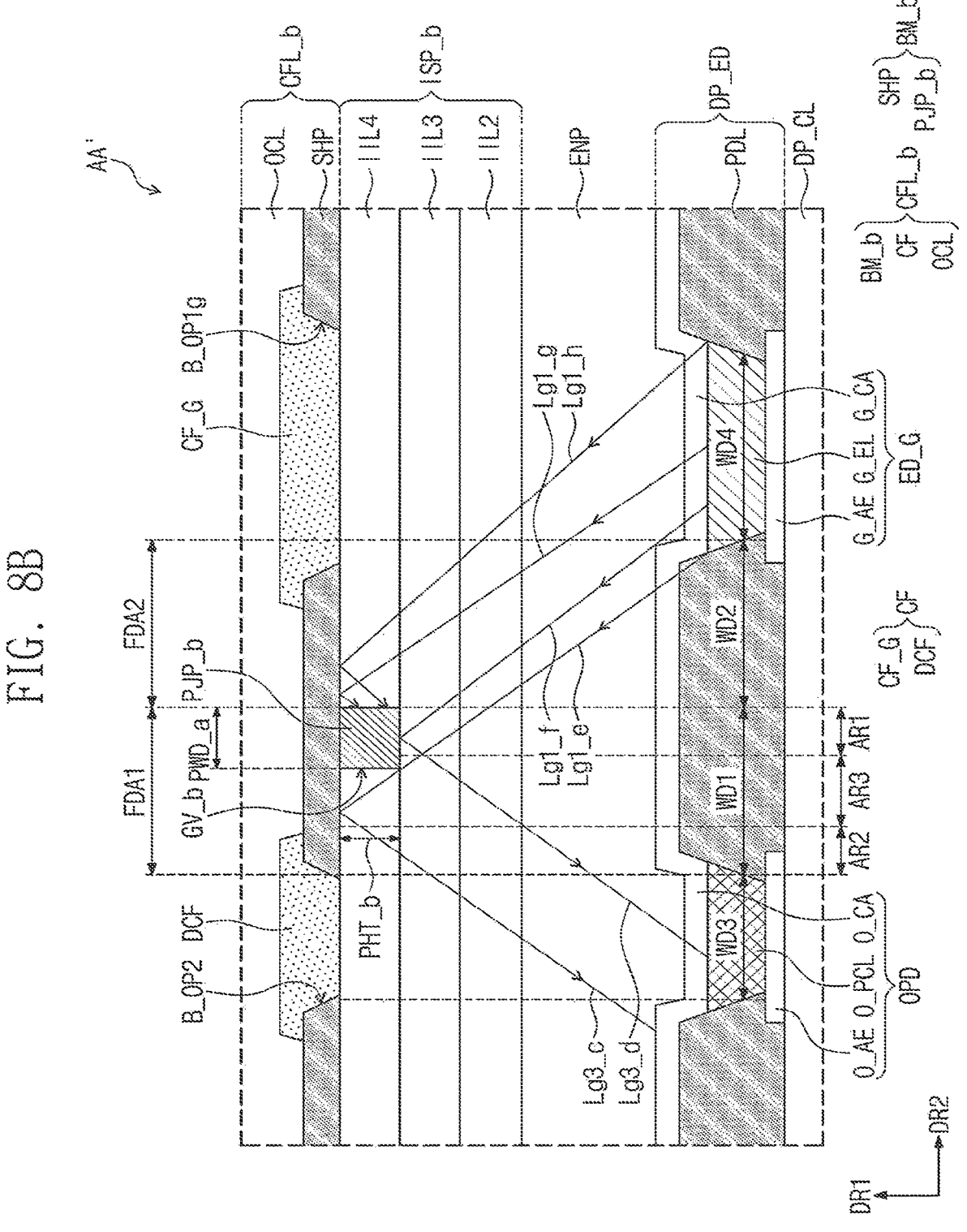

Referring to FIG. 8B, a color filter layer CFL_b includes the light blocking layer BM_b, the color filter CF, and the over-coating layer OCL. The light blocking layer BM_b includes the light blocking portion SHP, and a protrusion PJP_b. Hereinafter, the same or substantially the same components as those described above with reference to FIG. 8A will be assigned the same reference symbols, and thus, redundant description thereof may not be repeated.

In an embodiment of the present disclosure, an input sensing layer ISP_b further includes a fourth sensing insulation layer IIL4. The fourth sensing insulation layer IIL4 may be disposed on the third sensing insulation layer IIL3. The fourth sensing insulation layer IIL4 includes a groove GV_b formed to correspond to the protrusion PJP_b. In an embodiment of the present disclosure, the groove GV_b may be formed through the fourth sensing insulation layer IIL4. The protrusion PJP_b is accommodated in the groove GV_b. However, the present disclosure is not limited thereto. The third sensing insulation layer IIL3 and the fourth sensing insulation layer IIL4 may be formed as single insulation layer, and the groove GV_b may be formed through the single insulation layer.

The protrusion height PHT_b of the protrusion PJP_b illustrated in FIG. 8B is greater than the protrusion height PHT_a of the protrusion PJP_a illustrated in FIG. 8A. As the protrusion height of the protrusion PJP_b is increased, an effect of preventing or substantially preventing light output from the green light emitting element ED_G and reflected at a point located in the direction opposite to the first reference direction from the reference point of the light blocking portion SHP from being provided to the light receiving element OPD may be enhanced.

In an embodiment of the present disclosure, from among the light output from the green light emitting element ED_G, light provided from the reference point of the light blocking portion SHP to a point located at a distance greater than half of the third width WD3 in the first reference direction from the reference point is referred to as fifth incident light Lg1_e, and the fifth incident light Lg1_e reflected by the light blocking portion SHP is referred to as third reflected light Lg3_c. Light provided from the green light emitting element ED_G toward the protrusion PJP_b is referred to as sixth incident light Lg1_f, and the sixth incident light Lg1_f reflected by the protrusion PJP_b is referred to as fourth reflected light Lg3_d. From among incident light provided from the green light emitting element ED_G, light blocked by the protrusion PJP_b, even though reflected by the light blocking portion SHP, is referred to as seventh incident light Lg1_g and eighth incident light Lg1_h. The fourth reflected light Lg3_d may be provided to the light receiving element OPD by the protrusion PJP_b. However, even in this case, the seventh incident light Lg1_g and the eighth incident light Lg1_h provided from the green light emitting element ED_G are blocked by the protrusion PJP_b, and are not provided to the light receiving element OPD, and thus, reliability of the measurement of the fingerprint information of the user US by the light receiving element OPD may be improved.

Figure 8C:
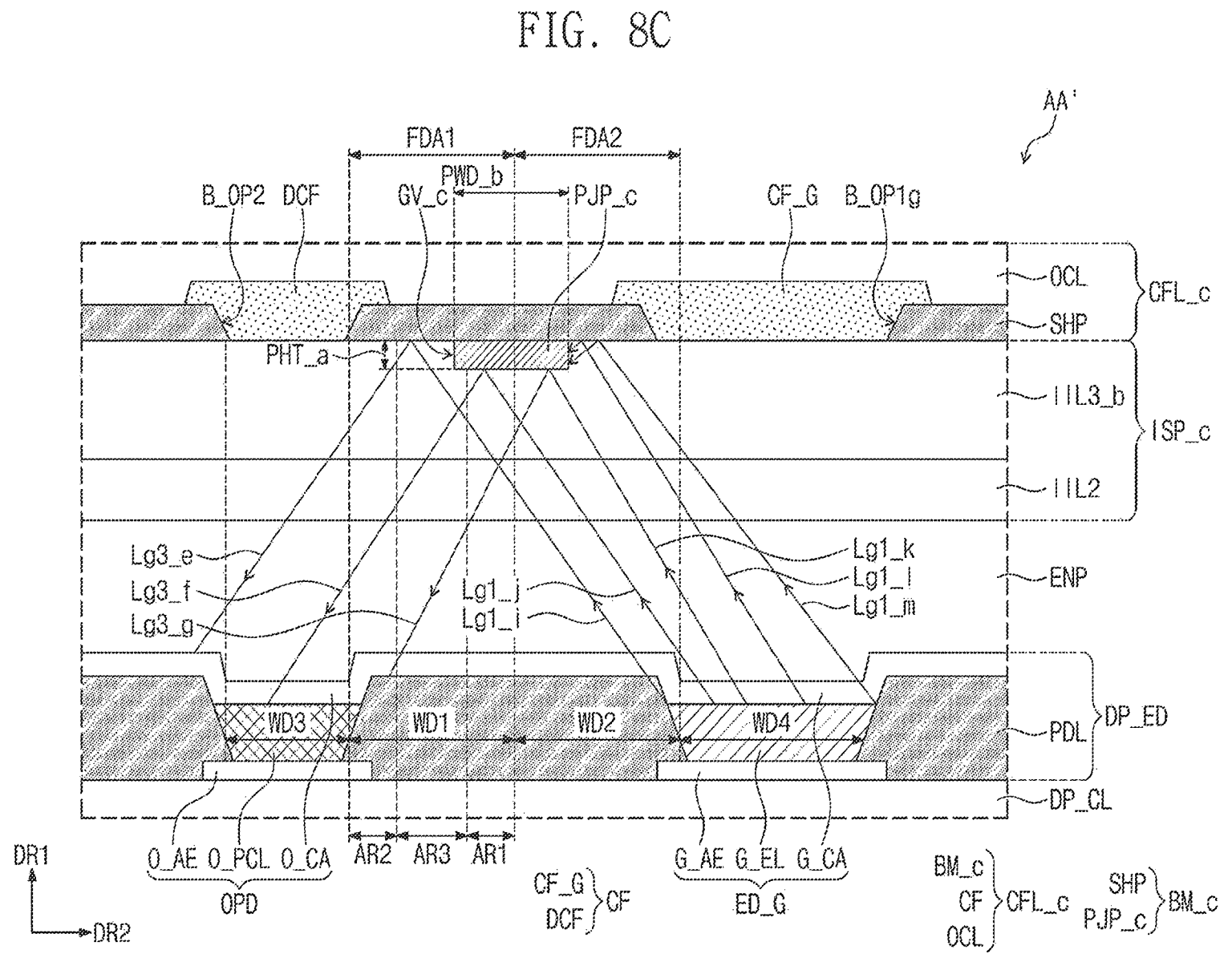

Referring to FIG. 8C, a color filter layer CFL_c includes the light blocking layer BM_c, the color filter CF, and the over-coating layer OCL. The light blocking layer BM_c includes the light blocking portion SHP and a protrusion PJP_c. Hereinafter, components that are the same or substantially the same as those described above with reference to FIGS. 8A and 8B are assigned the same reference symbols, and thus, redundant description thereof may not be repeated.

In an embodiment of the present disclosure, a third sensing insulation layer IIL3_b included in an input sensing layer ISP_c includes a groove GV_c formed to correspond to the protrusion PJP_c. The protrusion PJP_c is accommodated in the groove GV_c.

The protrusion width PWD_b of the protrusion PJP_c illustrated in FIG. 8C is greater than the protrusion width PWD_a of the protrusion PJP_a illustrated in FIG. 8A. In an embodiment of the present disclosure, the protrusion PJP_c may overlap with the first defining area FDA1 and the second defining area FDA2. The protrusion PJP_c may have a shape extending from the reference point in the first reference direction and the second direction DR2. The protrusion PJP_c may overlap with the first area AR1 at (e.g., in or on) the first defining area FDA1. The protrusion PJP_c may overlap with the first area AR1 and the second area AR2 at (e.g., in or on) the first defining area FDA1. In some embodiments, at (e.g., in or on) the second defining area FDA2, the protrusion PJP_c overlaps with an area adjacent to the first defining area FDA1, and does not overlap with an area adjacent to the green light emitting element ED_G.

When the protrusion PJP_c is disposed at (e.g., in or on) the first defining area FDA1 and the second defining area FDA2, light output from the green light emitting element ED_G and reflected in the direction opposite to the first reference direction from the reference point of the light blocking portion SHP may not move a distance to be provided to the light receiving element OPD. Accordingly, reliability of the measurement of the fingerprint information of the user US by the light receiving element OPD may be improved.

In an embodiment of the present disclosure, from among light output from the green light emitting element ED_G, light provided from the reference point of the light blocking portion SHP to a point located at a distance greater than half of the third width WD3 in the first reference direction from the reference point is referred to as ninth incident light Lg1_i, and the ninth incident light Lg1_i reflected by the light blocking portion SHP is referred to as fifth reflected light Lg3_e. Light provided from the green light emitting element ED_G toward the protrusion PJP_c is referred to as tenth incident light Lg1_j and eleventh incident light Lg1_k, the tenth incident light Lg1_j reflected by the protrusion PJP_c is referred to as sixth reflected light Lg3_f, and the eleventh incident light Lg1_k reflected by the protrusion PJP_c is referred to as seventh reflected light Lg3_g. From among incident light provided from the green light emitting element ED_G, light blocked by the protrusion PJP_c, even though reflected by the light blocking portion SHP, is referred to as twelfth incident light Lg1_I and thirteenth incident light Lg1_m. The sixth reflected light Lg3_f may be provided to the light receiving element OPD by the protrusion PJP_c. However, even in this case, the seventh reflected light Lg3_g reflected by the protrusion PJP_c, and the twelfth incident light Lg1_I and the thirteenth incident light Lg1_m provided from the green light emitting element ED_G and blocked by the protrusion PJP_c, are not provided to the light receiving element OPD, and thus, reliability of the measurement of the fingerprint information of the user US by the light receiving element OPD may be improved.

Figure 8D:
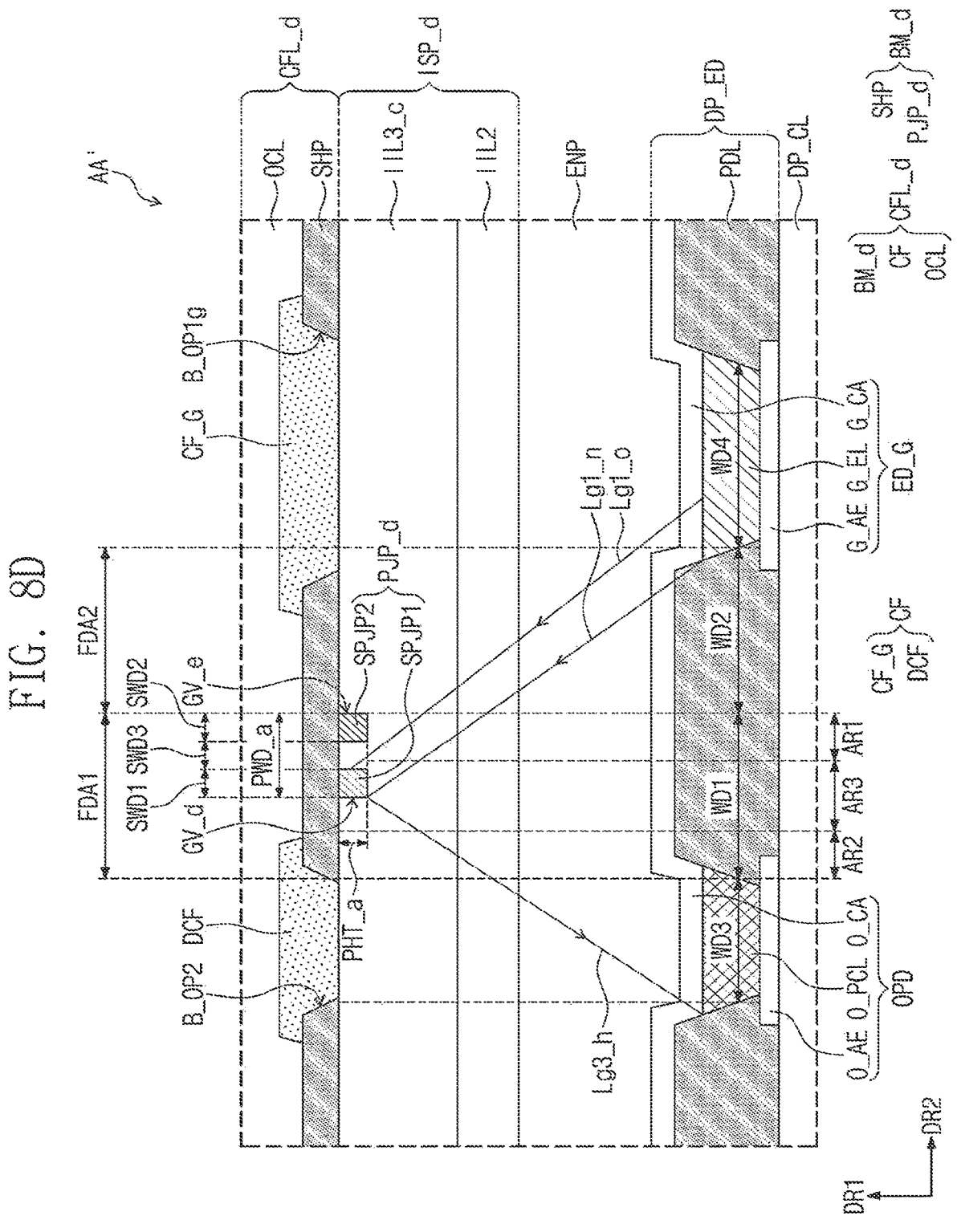

Referring to FIG. 8D, a color filter layer CFL_d includes the light blocking layer BM_d, the color filter CF, and the over-coating layer OCL. The light blocking layer BM_d includes the light blocking portion SHP and protrusions PJP_d. Hereinafter, components that are the same or substantially the same as those described above with reference to FIGS. 8A, 8B, and 8C are assigned the same reference symbols, and thus, redundant description thereof may not be repeated.

In an embodiment of the present disclosure, a third sensing insulation layer IIL3_c included in an input sensing layer ISP_d includes a plurality of grooves GV_d and GV_e formed to correspond to the protrusions PJP_d. The protrusions PJP_d are accommodated in the grooves GV_d and GV_e. In more detail, the protrusions PJP_d include a first sub-protrusion SPJP1 and a second sub-protrusion SPJP2. The first sub-protrusion SPJP1 and the second sub-protrusion SPJP2 are spaced apart from each other in the second direction DR2. The first sub-protrusion SPJP1 is accommodated in a first groove GV_d of the grooves GV_d and GV_2, and the second sub-protrusion SPJP2 is accommodated in a second groove GV_e of the grooves GV_d and GV_e.

In an embodiment of the present disclosure, the length of the first sub-protrusion SPJP1 in the first reference direction is a first sub-width SWD1. The length of the second sub-protrusion SPJP2 in the first reference direction is a second sub-width SWD2. The length by which the first sub-protrusion SPJP1 and the second sub-protrusion SPJP2 are spaced apart from each other in the first reference direction is a third sub-width SWD3. In an embodiment of the present disclosure, a sum of the first, second, and third sub-widths SWD1, SWD2, and SWD3 may be smaller than or equal to half of the third width WD3.

In an embodiment of the present disclosure, the protrusion width PWD_a of the protrusion PJP_a illustrated in FIG. 8A may be equal to or substantially equal to the sum of the first, second, and third sub-widths SWD1, SWD2, and SWD3 illustrated in FIG. 8D.

In an embodiment of the present disclosure, light provided from the green light emitting element ED_G toward the first sub-protrusion SPJP1 is referred to as fourteenth incident light Lg1_n, and the fourteenth incident light Lg1_n reflected by the first sub-protrusion SPJP1 is referred to as eighth reflected light Lg3_h. From among incident light provided from the green light emitting element ED_G, light provided between the first sub-protrusion SPJP1 and the second sub-protrusion SPJP2 and blocked by the first sub-protrusion SPJP1 or the second sub-protrusion SPJP2 is referred to as fifteenth incident light Lg1_o.

The eighth reflected light Lg3_h may be provided to the light receiving element OPD by the first sub-protrusion SPJP1. However, even in this case, the fifteenth incident light Lg1_o is not provided to the light receiving element OPD, and thus, reliability of the measurement of the fingerprint information of the user US by the light receiving element OPD may be improved. Furthermore, in some embodiments, light provided from the green light emitting element ED_G may be blocked by the second sub-protrusion SPJP2, and may not be provided to the light receiving element OPD, or light reflected by the first and second sub-protrusions SPJP1 and SPJP2 may not move a distance to be provided to the light receiving element OPD, and thus, may not be provided to the light receiving element OPD. Accordingly, reliability of the measurement of the fingerprint information of the user US by the light receiving element OPD may be improved.

Figure 9A:
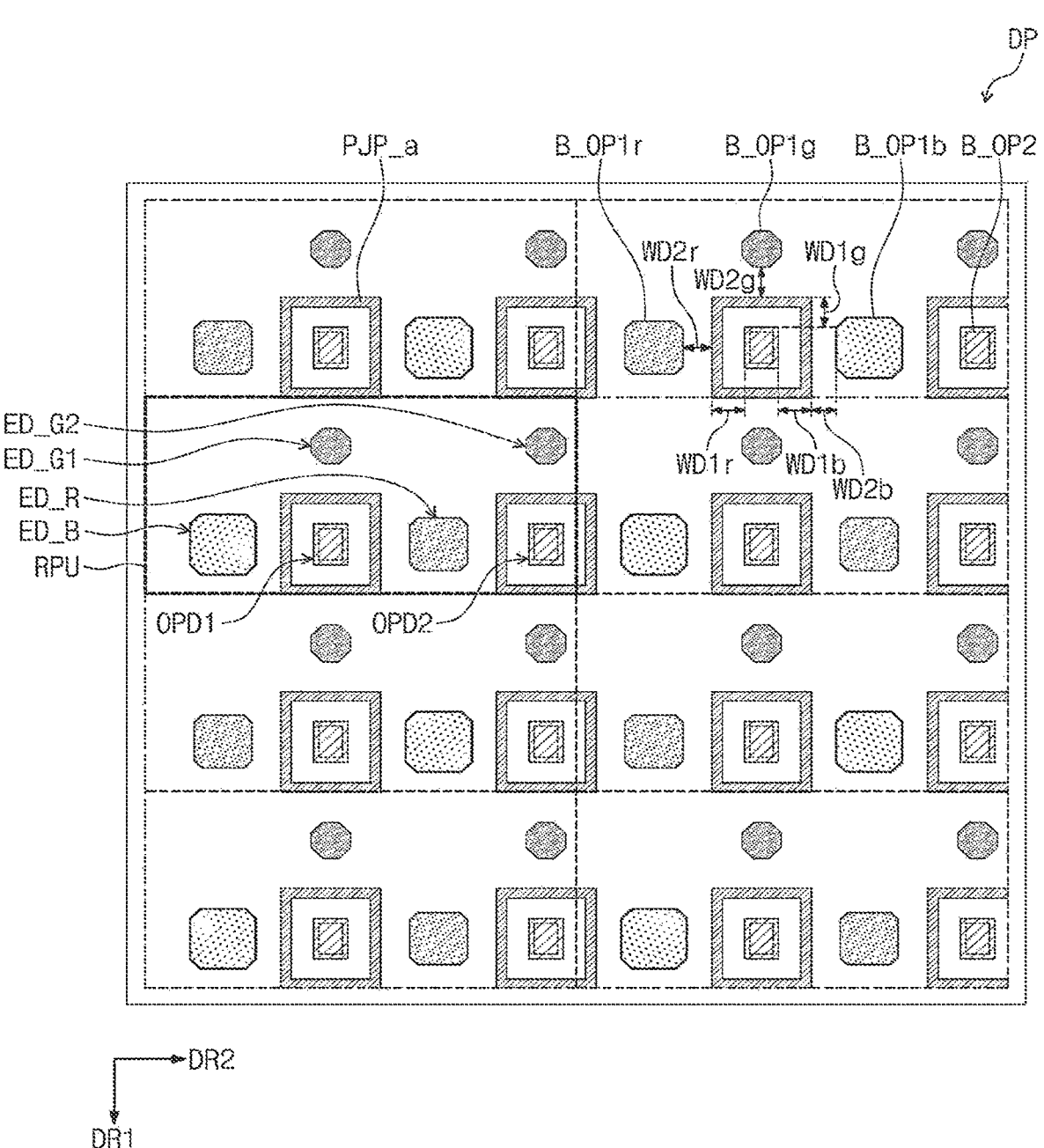
FIGS. 9A-9C are plan views illustrating protrusions according to embodiments of the present disclosure.
Figure 9B:
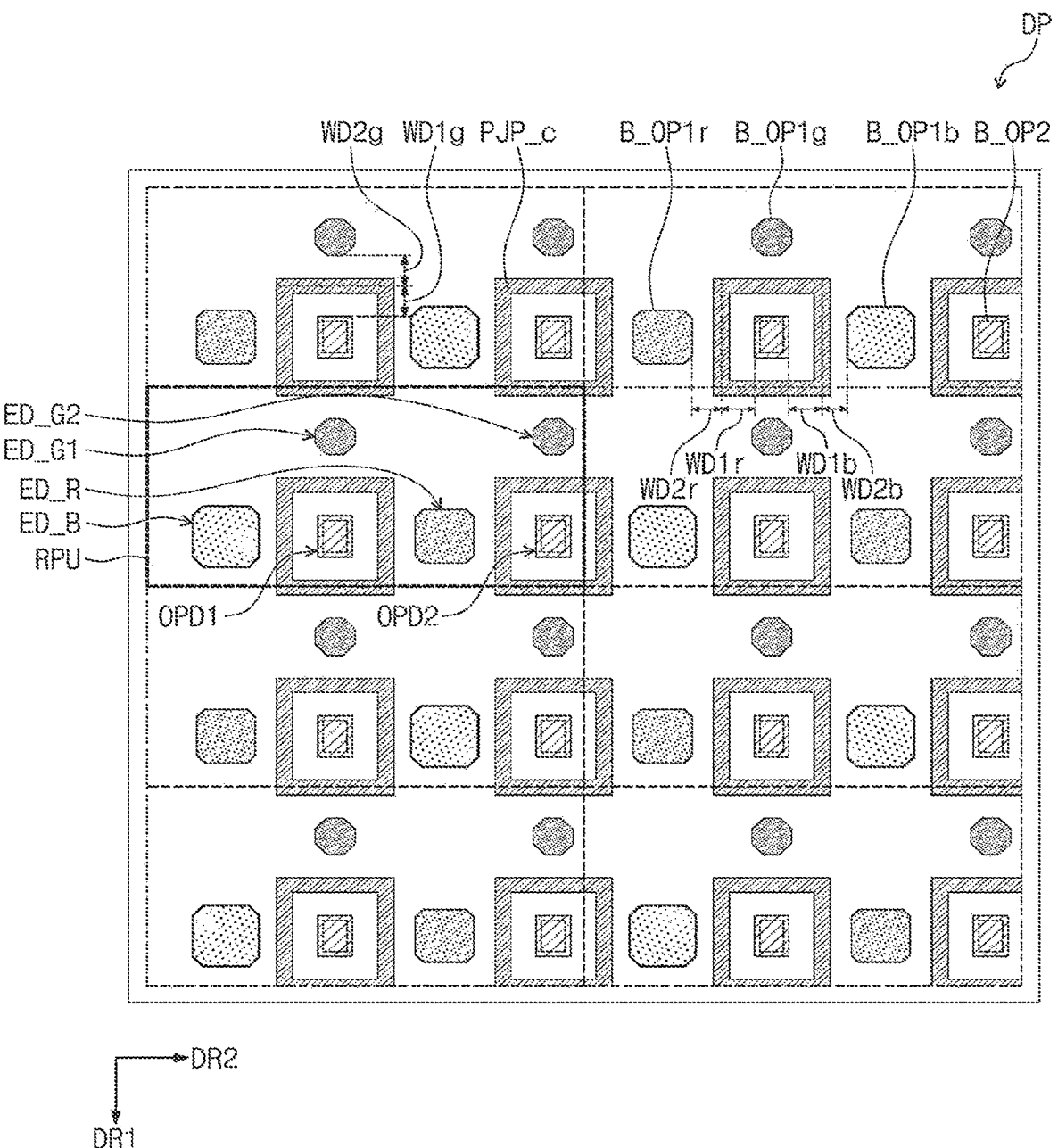
Figure 9C:
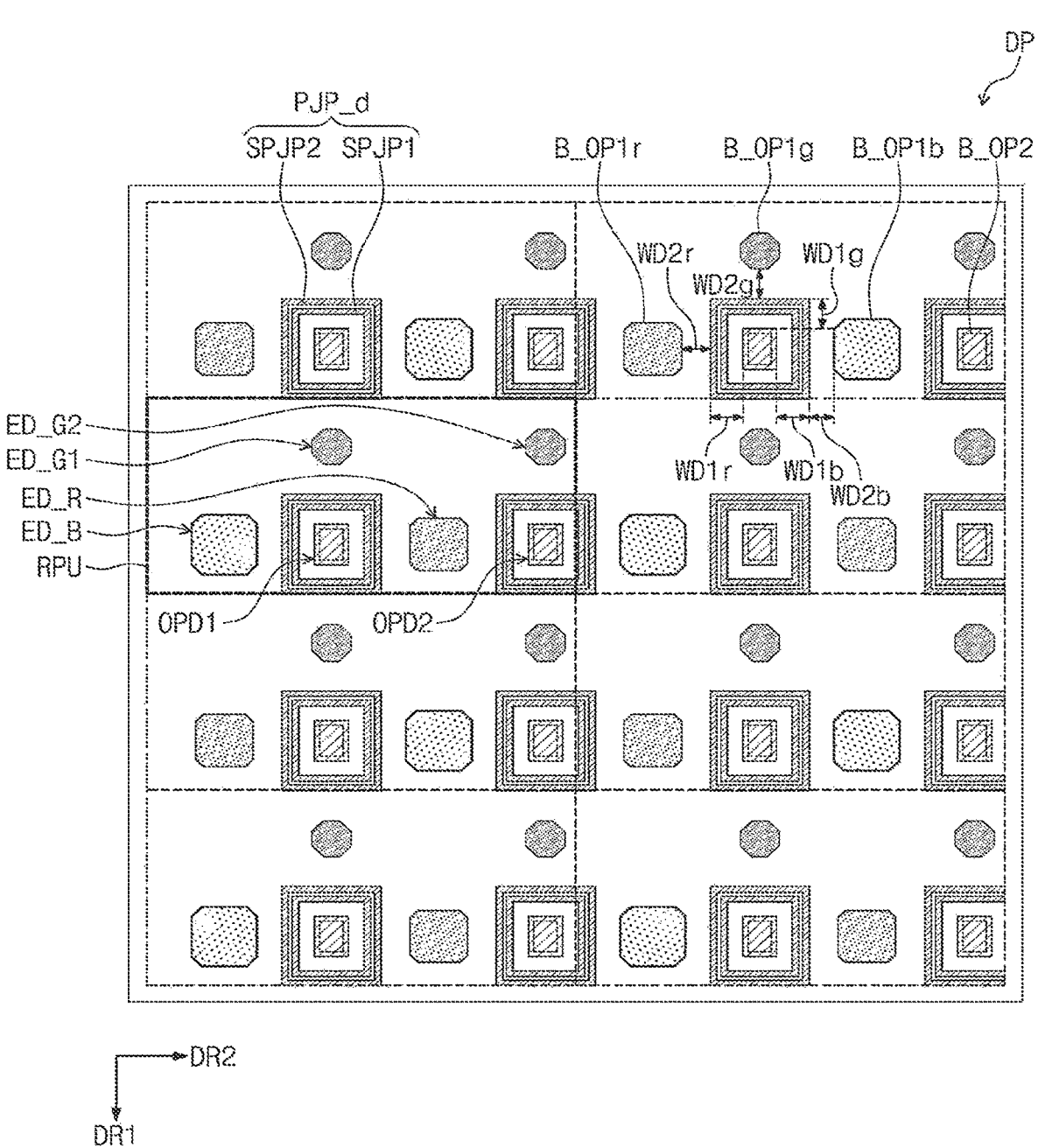

FIGS. 9A to 9C are plan views illustrating protrusions according to embodiments of the present disclosure. Hereinafter, components that are the same or substantially the same as those described above with reference to FIGS. 7A and 8A are assigned the same reference symbols, and thus, redundant description thereof may not be repeated.

FIG. 9A is an enlarged plan view of a partial area of the display panel DP (e.g., see FIG. 5). The display panel DP includes the plurality of pixels PX and the plurality of light receiving sensors FX.

Referring to FIGS. 5 and 9A, the plurality of pixels PX may be grouped into a plurality of reference pixel units RPU, each of which is repeated. In an embodiment of the present disclosure, each of the reference pixel units RPU may include four pixels, or in other words, a first pixel (hereinafter, referred to as the red pixel), two second pixels (hereinafter, referred to as first and second green pixels), and a third pixel (hereinafter, referred to as the blue pixel). However, the number of pixels included in each reference pixel unit RPU is not limited thereto. As another example, each reference pixel unit RPU may include three pixels, or in other words, the red pixel, the first green pixel (or the second green pixel), and the blue pixel.

The red pixel includes a first light emitting element ED_R (hereinafter, referred to as the red light emitting element), the first and second green pixels include second light emitting elements ED_G1 and ED_G2 (hereinafter, referred to as first and second green light emitting elements), respectively, and the blue pixel includes a third light emitting element ED_B (hereinafter, referred to as the blue light emitting element). In an embodiment of the present disclosure, the red light emitting element ED_R outputs first color light (e.g., red light), the first and second green light emitting elements ED_G1 and ED_G2 output second color light (e.g., green light), and the blue light emitting element ED_B outputs third color light (e.g., blue light).

The red light emitting elements ED_R and the blue light emitting elements ED_B may be alternately and repeatedly disposed in the first and second directions DR1 and DR2. The first and second green light emitting elements ED_G1 and ED_G2 may be disposed in the same row as each other. The first and second green light emitting elements ED_G1 and ED_G2 may be arranged in the first direction DR1. The first and second green light emitting elements ED_G1 and ED_G2 may be disposed in different columns from each other. The first and second green light emitting elements ED_G1 and ED_G2 may be alternately arranged in the second direction DR2. The first and second green light emitting elements ED_G1 and ED_G2 may be disposed in different rows and columns from those of the red light emitting elements ED_R and the blue light emitting elements ED_B in the first and second directions DR1 and DR2.

In an embodiment of the present disclosure, the red light emitting element ED_R may have a larger size than those of the first and second green light emitting elements ED_G1 and ED_G2. Furthermore, the blue light emitting element ED_B may have a size greater than or equal to the size of the red light emitting element ED_R. The sizes of the light emitting elements ED_R, ED_G1, ED_G2, and ED_B are not limited thereto, and may be variously modified. For example, in an embodiment of the present disclosure, the light emitting elements ED_R, ED_G1, ED_G2, and ED_B may have the same or substantially the same size as each other.

The first and second green light emitting elements ED_G1 and ED_G2 may have the same or substantially the same shape as those of the red and blue light emitting elements ED_R and ED_B. In an embodiment of the present disclosure, each of the red and blue light emitting elements ED_R and ED_B may have an octagonal shape having the same or substantially the same length in the first direction DR1 and the second direction DR2. In other words, the red and blue light emitting elements ED_R and ED_B may have the same or substantially the same size as each other or different sizes from each other, but may have the same or substantially the same shape as each other.

Each of the first and second green light emitting elements ED_G1 and ED_G2 may have an octagonal shape having the same or substantially the same length in the first direction DR1 and the second direction DR2. In an embodiment of the present disclosure, the first and second green light emitting elements ED_G1 and ED_G2 have the same or substantially the same size and shape as each other. However, the shapes of the light emitting elements ED_R, ED_G1, ED_G2, and ED_B are not limited thereto. The shapes of the light emitting elements ED_R, ED_G1, ED_G2, and ED_B may be variously modified. In an embodiment of the present disclosure, each of the light emitting elements ED_R, ED_G1, ED_G2, and ED_B may have a circular shape, a rectangular shape, or a diamond shape.

The plurality of light receiving sensors FX may be grouped into the plurality of reference pixel units RPU, each of which is repeated. In an embodiment of the present disclosure, each of the reference pixel units RPU may include two light receiving sensors, or in other words, a first light receiving sensor and a second light receiving sensor. However, the number of light receiving sensors included in each reference pixel unit RPU is not limited thereto. As another example, each reference pixel unit RPU may include one light receiving sensor or three or more light receiving sensors.

The first light receiving sensor includes a first light receiving element OPD1, and the second light receiving sensor includes a second light receiving element OPD2. Each of the first and second light receiving elements OPD1 and OPD2 is disposed between the red light emitting element ED_R and the blue light emitting element ED_B in the second direction DR2. Each of the first and second light receiving elements OPD1 and OPD2 may be disposed to be adjacent to the first green light emitting element ED_G1 or the second green light emitting element Ed_G2 in the first direction DR1. In an embodiment of the present disclosure, the first light receiving element OPD1 is disposed between two first green light emitting elements ED_G1 that are adjacent to each other in the first direction DR1. The second light receiving element OPD2 is disposed between two second green light emitting elements ED_G2 that are adjacent to each other in the first direction DR1.

The first and second light receiving elements OPD1 and OPD2 may have the same or substantially the same size and shape as each other. Each of the first and second light receiving elements OPD1 and OPD2 may have a smaller size than those of the red and blue light emitting elements ED_R and ED_B. In an embodiment of the present disclosure, each of the first and second light receiving elements OPD1 and OPD2 may have a size that is the same or substantially the same as, or similar to, the sizes of the first and second green light emitting elements ED_G1 and ED_G2. However, the sizes of the first and second light receiving elements OPD1 and OPD2 are not particularly limited, and may be variously modified. The first and second light receiving elements OPD1 and OPD2 may have a different shape from those of the red and blue light emitting elements ED_R and ED_B. In an embodiment of the present disclosure, each of the first and second light receiving elements OPD1 and OPD2 may have a rectangular shape. Each of the first and second light receiving elements OPD1 and OPD2 may have a rectangular shape that is longer in the first direction DR1 than in the second direction DR2. As another example, each of the first and second light receiving elements OPD1 and OPD2 may have a square shape having the same length in the first direction DR1 and the second direction DR2.

Referring to FIGS. 8A and 9A, the protrusion PJP_a is disposed between the second color filter CF_G and the dummy color filter DCF. Hereinafter, the second color filter CF_G is referred to as the first sub-color filter CF_G, and the dummy color filter DCF is referred to as the second sub-color filter DCF.

The protrusion PJP_a is disposed adjacent to the second sub-color filter DCF. The protrusion PJP_a surrounds (e.g., around a periphery of) the second sub-color filter DCF on a plane (e.g., in a plan view).

In an embodiment of the present disclosure, the protrusion PJP_a is disposed between the first light blocking opening B_OP1 (e.g., refer to FIG. 7A) and the second light blocking opening B_OP2. The protrusion PJP_a surrounds (e.g., around a periphery of) the second light blocking opening B_OP2 on the plane (e.g., in a plan view). The protrusion PJP_a does not overlap with the second light blocking opening B_OP2. In an embodiment of the present disclosure, the first light blocking opening B_OP1 includes the first sub-opening B_OP1$r$, the second sub-opening B_OP1$g$, and the third sub-opening B_OP1$b$. The protrusion PJP_a may be disposed between the first sub-opening B_OP1$r$ and the second light blocking opening B_OP2, between the second sub-opening B_OP1$g$ and the second light blocking opening B_OP2, and between the third sub-opening B_OP1$b$ and the second light blocking opening B_OP2. In an embodiment of the present disclosure, the protrusion PJP_a may surround (e.g., around a periphery of) the second light blocking opening B_OP2 in a shape corresponding to the shape of the light receiving element OPD. In an embodiment of the present disclosure, when the light receiving element OPD has a rectangular shape that is longer in the first direction DR1 than in the second direction DR2, the protrusion PJP_a may surround (e.g., around a periphery of) the second light blocking opening B_OP2 in a rectangular shape that is longer in the first direction DR1 than in the second direction DR2.

In an embodiment of the present disclosure, referring to FIGS. 8A and 9A, the length WD1$g$ of a first defining area (hereinafter, referred to as a first green defining area) between the first green light emitting element ED_G1 and the first light receiving element OPD1 and the length WD2$g$ of a second defining area (hereinafter, referred to as a second green defining area) between the first green light emitting element ED_G1 and the first light receiving element OPD1 may be equal to or substantially equal to each other. In this case, the protrusion PJP_a is disposed at (e.g., in or on) the first green defining area. The length WD1$r$ of a first defining area (hereinafter, referred to as a first red defining area)

between the red light emitting element ED_R and the first light receiving element OPD1 and the length WD2$r$ of a second defining area (hereinafter, referred to as a second red defining area) between the red light emitting element ED_R and the first light receiving element OPD1 may be equal to or substantially equal to each other. In this case, the protrusion PJP_a is disposed in the first red defining area. The length WD1$b$ of a first defining area (hereinafter, referred to as a first blue defining area) between the blue light emitting element ED_B and the first light receiving element OPD1 and the length WD2$b$ of a second defining area (hereinafter, referred to as a second blue defining area) between the blue light emitting element ED_B and the first light receiving element OPD1 may be equal to or substantially equal to each other. In this case, the protrusion PJP_a is disposed in the first blue defining area.

Referring to FIGS. 8C and 9B, the length WD1$g$ of the first green defining area between the first green light emitting element ED_G1 and the first light receiving element OPD1 and the length WD2$g$ of the second green defining area between the first green light emitting element ED_G1 and the first light receiving element OPD1 may be equal to or substantially equal to each other. In this case, the protrusion PJP_c is disposed in the first green defining area and the second green defining area. The length WD1$r$ of the first red defining area between the red light emitting element ED_R and the first light receiving element OPD1 and the length WD2$r$ of the second red defining area between the red light emitting element ED_R and the first light receiving element OPD1 may be equal to or substantially equal to each other. In this case, the protrusion PJP_c is disposed in the first red defining area and the second red defining area. The length WD1$b$ of the first blue defining area between the blue light emitting element ED_B and the first light receiving element OPD1 and the length WD2$b$ of the second blue defining area between the blue light emitting element ED_B and the first light receiving element OPD1 may be equal to or substantially equal to each other. In this case, the protrusion PJP_c is disposed in the first blue defining area and the second blue defining area.

Referring to FIGS. 8D and 9C, the length WD1$g$ of the first green defining area between the first green light emitting element ED_G1 and the first light receiving element OPD1 and the length WD2$g$ of the second green defining area between the first green light emitting element ED_G1 and the first light receiving element OPD1 may be equal to or substantially equal to each other. In this case, the protrusion PJP_d is disposed in the first green defining area. In more detail, the first sub-protrusion SPJP1 and the second sub-protrusion SPJP2 are disposed in the first green defining area. The length WD1$r$ of the first red defining area between the red light emitting element ED_R and the first light receiving element OPD1 and the length WD2$r$ of the second red defining area between the red light emitting element ED_R and the first light receiving element OPD1 may be equal to or substantially equal to each other. In this case, the protrusion PJP_d is disposed in the first red defining area. In more detail, the first sub-protrusion SPJP1 and the second sub-protrusion SPJP2 are disposed in the first red defining area. The length WD1$b$ of the first blue defining area between the blue light emitting element ED_B and the first light receiving element OPD1 and the length WD2$b$ of the second blue defining area between the blue light emitting element ED_B and the first light receiving element OPD1 may be equal to or substantially equal to each other. In this case, the protrusion PJP_d is disposed in the first blue defining area. In more detail, the first sub-protrusion SPJP1 and the second sub-protrusion SPJP2 are disposed in the first blue defining area. In this case, in an embodiment of the present disclosure, the first sub-protrusion SPJP1 and the second sub-protrusion SPJP2 may have shapes corresponding to each other.

According to one or more embodiments of the present disclosure, the light blocking layer included in the display device includes the protrusion protruding from the light blocking portion toward the element defining film disposed between the light emitting element and the light receiving element. Accordingly, light provided from the light emitting element may be prevented or substantially prevented from being reflected by the light blocking portion to the light receiving element. As a result, the sensor performance of the display device that recognizes biometric information of a user may be improved.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a display panel configured to display an image; and
a light blocking layer over the display panel,
wherein the display panel comprises:
    a base layer; and
    an element layer over the base layer, the element layer comprising a light emitting element, a light receiving element, and an element defining film between the light emitting element and the light receiving element, and
wherein the light blocking layer comprises:
    a light blocking portion overlapping with the element defining film, the light blocking portion having a first light blocking opening overlapping with the light emitting element, and a second light blocking opening overlapping with the light receiving element; and
    a protrusion protruding from the light blocking portion toward the element defining film.

2. The display device of claim 1, further comprising:
an input sensing layer between the display panel and the light blocking layer.

3. The display device of claim 2, wherein the input sensing layer comprises:
    a conductive layer; and
    an insulating layer on the conductive layer.

4. The display device of claim 3, wherein the insulating layer comprises a groove corresponding to the protrusion, and
    wherein the protrusion is accommodated in the groove.

5. The display device of claim 1, wherein the protrusion is located between the first light blocking opening and the second light blocking opening.

6. The display device of claim 5, wherein the protrusion surrounds the second light blocking opening.

7. The display device of claim 1, wherein the element defining film comprises:
    a first defining area adjacent to the light receiving element; and
    a second defining area between the light emitting element and the first defining area, and
    wherein the protrusion is located at the first defining area.

8. The display device of claim 7, wherein the first light blocking opening and the second light blocking opening are located along a first reference direction, and
    wherein a first width of the first defining area in the first reference direction is equal to a second width of the second defining area in the first reference direction.

9. The display device of claim 8, wherein the first defining area comprises:
    a first area adjacent to the second defining area;
    a second area adjacent to the light receiving element; and
    a third area between the first area and the second area, and
    wherein the protrusion overlaps with the first area and the third area.

10. The display device of claim 9, wherein the protrusion does not overlap with the second area.

11. The display device of claim 9, wherein the light receiving element has a third width in the first reference direction, and
    wherein the protrusion has a width in the first reference direction that is smaller than or equal to half of the third width.

12. The display device of claim 11, wherein the protrusion does not overlap with the second light blocking opening.

13. The display device of claim 9, wherein the light receiving element has a third width in the first reference direction, the light emitting element has a fourth width in the first reference direction, and the protrusion protrudes toward the element defining film in a second reference direction, and
    wherein a height of the protrusion in the second reference direction is proportional to half of a difference between the fourth width and the third width.

14. The display device of claim 9, wherein the protrusion protrudes toward the element defining film in a second reference direction, and
    wherein a width of the protrusion in the first reference direction is greater than a height of the protrusion in the second reference direction.

15. The display device of claim 9, wherein the protrusion comprises a first sub-protrusion, and a second sub-protrusion spaced from the first sub-protrusion.

16. The display device of claim 15, wherein the first sub-protrusion has a first sub-width in the first reference direction, the second sub-protrusion has a second sub-width in the first reference direction, the first sub-protrusion and the second sub-protrusion are spaced from each other in the first reference direction by a third sub-width, and the light receiving element has a third width in the first reference direction, and
    wherein a sum of the first sub-width, the second sub-width, and the third sub-width is smaller than or equal to half of the third width.

17. The display device of claim 1, further comprising:
a color filter overlapping with the light emitting element and the light receiving element.

18. The display device of claim 1, wherein the display panel further comprises an encapsulation layer on the element layer.

19. The display device of claim 18, wherein the protrusion protrudes toward the encapsulation layer.

20. The display device of claim 1, wherein the display panel further comprises a circuit layer between the base layer and the element layer, and wherein the circuit layer comprises:

a pixel drive circuit electrically connected with the light emitting element, and configured to control an operation of the light emitting element; and a sensing drive circuit electrically connected with the light receiving element, and configured to control an operation of the light receiving element.

21. A display device comprising:

a display panel configured to display an image;

an input sensing layer on the display panel; and a color filter layer on the input sensing layer, wherein the display panel comprises:

a base layer; and an element layer over the base layer, the element layer comprising a light emitting element, a light receiving element, and an element defining film between the light emitting element and the light receiving element, wherein the color filter layer comprises a color filter overlapping with the light emitting element and the light receiving element, and a light blocking layer, and wherein the light blocking layer comprises:

a light blocking portion overlapping with the element defining film; and a protrusion protruding toward the element defining film, and overlapping with the element defining film.

22. The display device of claim 21, wherein the input sensing layer comprises:

a conductive layer on the display panel; and a first insulating layer on the conductive layer, wherein the first insulating layer comprises a first groove corresponding to the protrusion, and wherein the protrusion is accommodated in the first groove.

23. The display device of claim 21, wherein the input sensing layer comprises:

a conductive layer on the display panel;

a first insulating layer on the conductive layer; and a second insulating layer on the first insulating layer, wherein the second insulating layer comprises a second groove corresponding to the protrusion, and wherein the protrusion is accommodated in the second groove.

24. The display device of claim 21, wherein the display panel further comprises a circuit layer between the base layer and the element layer, and wherein the circuit layer comprises:

a pixel drive circuit electrically connected with the light emitting element, and configured to control an operation of the light emitting element; and a sensing drive circuit electrically connected with the light receiving element, and configured to control an operation of the light receiving element.

25. The display device of claim 21, wherein the color filter comprises:

a first sub-color filter overlapping with the light emitting element; and a second sub-color filter overlapping with the light receiving element, and wherein the protrusion is located between the first sub-color filter and the second sub-color filter.

26. The display device of claim 25, wherein the protrusion is adjacent to the second sub-color filter.

27. The display device of claim 26, wherein the protrusion surrounds the second sub-color filter.

28. The display device of claim 21, wherein the display panel further comprises an encapsulation layer on the element layer.

29. The display device of claim 28, wherein the input sensing layer is directly on the encapsulation layer.

* * * * *